US011227960B2

(12) United States Patent
Bian et al.

(10) Patent No.: US 11,227,960 B2
(45) Date of Patent: Jan. 18, 2022

(54) MULTIFUNCTIONAL METAMATERIAL-BASED OPTICAL DEVICE

(71) Applicant: GLOBALFOUNDRIES U.S. Inc., Santa Clara, CA (US)

(72) Inventors: Yusheng Bian, Ballston, NY (US); Ajey Poovannummoottil Jacob, Watervliet, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 3 days.

(21) Appl. No.: 16/819,686

(22) Filed: Mar. 16, 2020

(65) Prior Publication Data
US 2021/0288191 A1 Sep. 16, 2021

(51) Int. Cl.
*H01L 31/0232* (2014.01)
*H01L 27/144* (2006.01)
*H01L 31/0224* (2006.01)

(52) U.S. Cl.
CPC .... *H01L 31/02327* (2013.01); *H01L 27/1443* (2013.01); *H01L 27/1446* (2013.01); *H01L 31/022408* (2013.01)

(58) Field of Classification Search
CPC ......... H01L 31/022408; H01L 27/1446; H01L 27/1443; H01L 31/02327
USPC .................................................. 257/432, 438
See application file for complete search history.

(56) References Cited

U.S. PATENT DOCUMENTS

| 3,656,827 | A | * | 4/1972 | Gamblin | ................. G03H 1/30 359/8 |
| 3,737,878 | A | * | 6/1973 | Gamblin | .............. G11B 7/0025 365/125 |
| 2011/0155891 | A1 | * | 6/2011 | Yamamoto | ........ H01L 27/14625 250/208.1 |

OTHER PUBLICATIONS

Cui and Zhou, "High-performance Ge-on-Si photodetector with optimized DBR location," Optics Letters, 42:5141-44, Dec. 15, 2017.
Emsley et al., "Silicon Substrates with Buried Distributed Bragg Reflectors for Resonant Cavity-Enhanced Optoelectronics," IEEE Journal of Selected Topics in Quantum Electronics, 8:948-55, Jul./Aug. 2002.
Giewont et al., "300-mm Monolithic Silicon Photonics Foundry Technology," IEEE Journal of Selected Topics in Quantum Electronics, vol. 25, No. 5, Sep./Oct. 2019.
Li et al., "Metamaterial grating-integrated graphene photodetector with broadband high responsivity," Applied Surface Science, 473:633-40, 2019.
Li et al., "Highly efficient polarization-independent grating coupler used in silica-based hybrid photodetector integration," Optical Engineering, 53(5), 057105, May 2014.
Luxmoore et al., "Graphene-Metamaterial Photodetectors for Integrated Infrared Sensing," ACS Photonics, 3:936-41, 2016.

(Continued)

*Primary Examiner* — Hrayr A Sayadian
(74) *Attorney, Agent, or Firm* — Yee Tze Lim; Hoffman Warnick LLC

(57) ABSTRACT

One illustrative optical device disclosed herein includes a base layer comprising a semiconductor material and a photodetector-coupler that comprises a detector-coupler element. The device also includes a first diode structure that is positioned in the detector-coupler element and a second diode structure that is positioned in the base layer, wherein the second diode structure is positioned vertically below at least a portion of detector-coupler element.

20 Claims, 20 Drawing Sheets

(56) References Cited

OTHER PUBLICATIONS

Montoya et al., "Ultra-thin infrared metamaterial detector for multicolor imaging applications," Optics Express, 25:23343-55, Sep. 18, 2017.
Quack et al., "Mid-Infrared Tunable Resonant Cavity Enhanced Detectors," Sensors, 8:5466-78, 2008.
Wu et al., "A critically coupled Germanium photodetector under vertical illumination," Optics Express, 20:29338-46, Dec. 31, 2012.
U.S. Appl. No. 16/253,191, filed Jan. 21, 2019, entitlted "Semiconductor Detectors Integrated with Bragg Reflectors and Methods of Forming Same".
U.S. Appl. No. 16/544,866, filed Aug. 19, 2019, entitled "Semiconductor Detectors with Butt-End Coupled Waveguide and Method of Forming the Same".

* cited by examiner

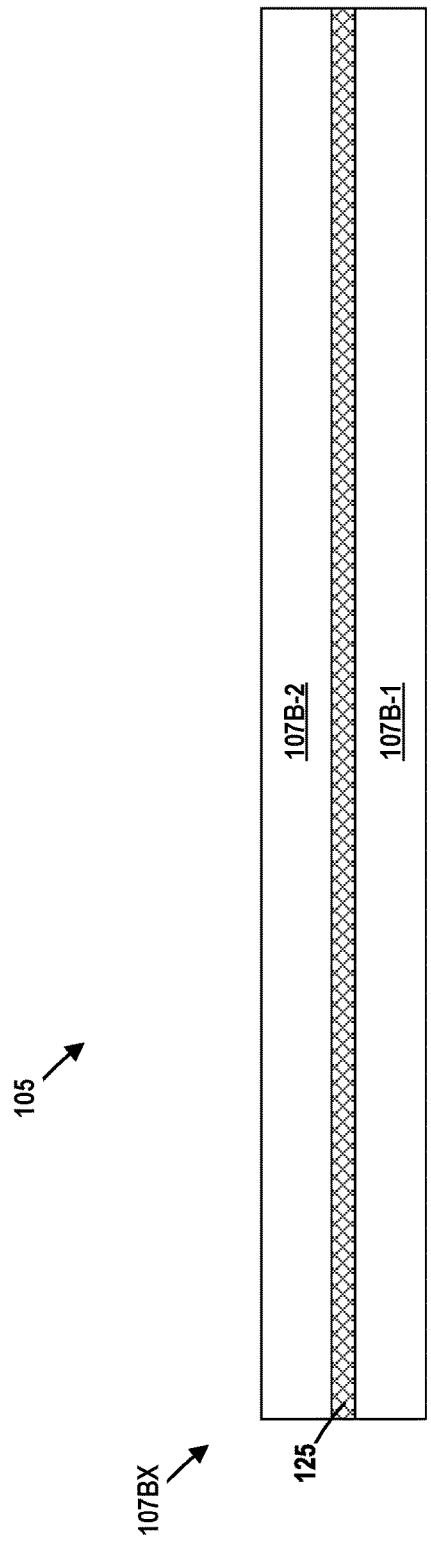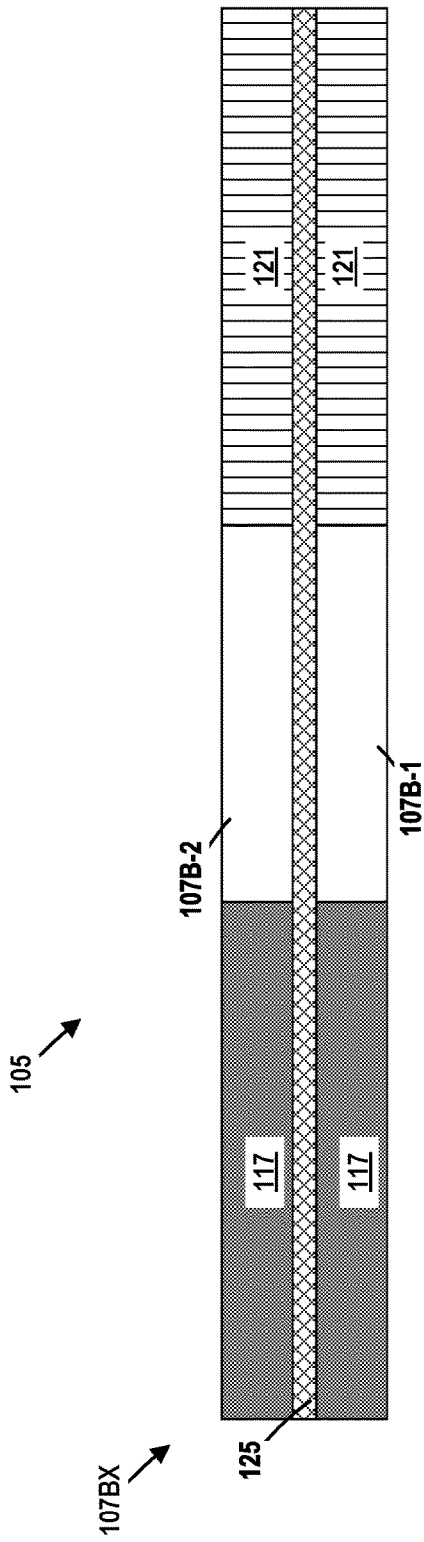

MULTIFUNCTIONAL METAMATERIAL-BASED OPTICAL DEVICE

BACKGROUND

Field of the Invention

The present disclosure generally relates to various novel embodiments of a multifunctional metamaterial-based optical device and various novel methods of making such a device.

Description of the Related Art

A need for greater bandwidth in fiber optic network links is widely recognized. The volume of data transmissions has seen a dramatic increase in the last decade. This trend is expected to grow exponentially in the near future. As a result, there exists a need for deploying an infrastructure capable of handling this increased volume and for improvements in system performance. Fiber optics communications have gained prominence in telecommunications, instrumentation, cable TV, network, and data transmission and distribution.

Photonics chips are used in many applications. A photonics chip integrates optical components, such as waveguides, couplers, photodetectors, etc., and electronic components, such as integrated circuits comprised of CMOS-based field-effect transistors, into a unified platform. The optical components must generally be able to perform at least the functions of light coupling, light propagation, light absorption and conversion of light to an electrical current. However, in prior art devices, the operations are performed by three or more components, which can lead to excessive consumption of valuable plot space on the photonics chip.

The present disclosure is generally directed to various novel embodiments of a multifunctional metamaterial-based optical device and various novel methods of making such a device.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a multifunctional metamaterial-based optical device and various novel methods of making such a device. One illustrative optical device disclosed herein includes a base layer comprising a semiconductor material and a photodetector-coupler that comprises a detector-coupler element. The device also includes a first diode structure that is positioned in the detector-coupler element and a second diode structure that is positioned in the base layer, wherein the second diode structure is positioned vertically below at least a portion of the detector-coupler element.

Another illustrative optical device disclosed herein includes a base layer comprising a semiconductor material and a photodetector-coupler that comprises a plurality of detector-coupler elements. The device also includes a plurality of first diode structures, each of which is positioned in one of the plurality of detector-coupler elements and a plurality of second diode structures positioned in the base layer, wherein each of the plurality of second diode structures is positioned vertically below at least a portion of one of the plurality of detector-coupler elements.

BRIEF DESCRIPTION OF THE DRAWINGS

The disclosure may be understood by reference to the following description taken in conjunction with the accompanying drawings, in which like reference numerals identify like elements, and in which:

FIGS. 1-22 depict various novel embodiments of a multifunctional metamaterial-based optical device and various novel methods of making such a device. The drawings are not to scale.

Figure 1:
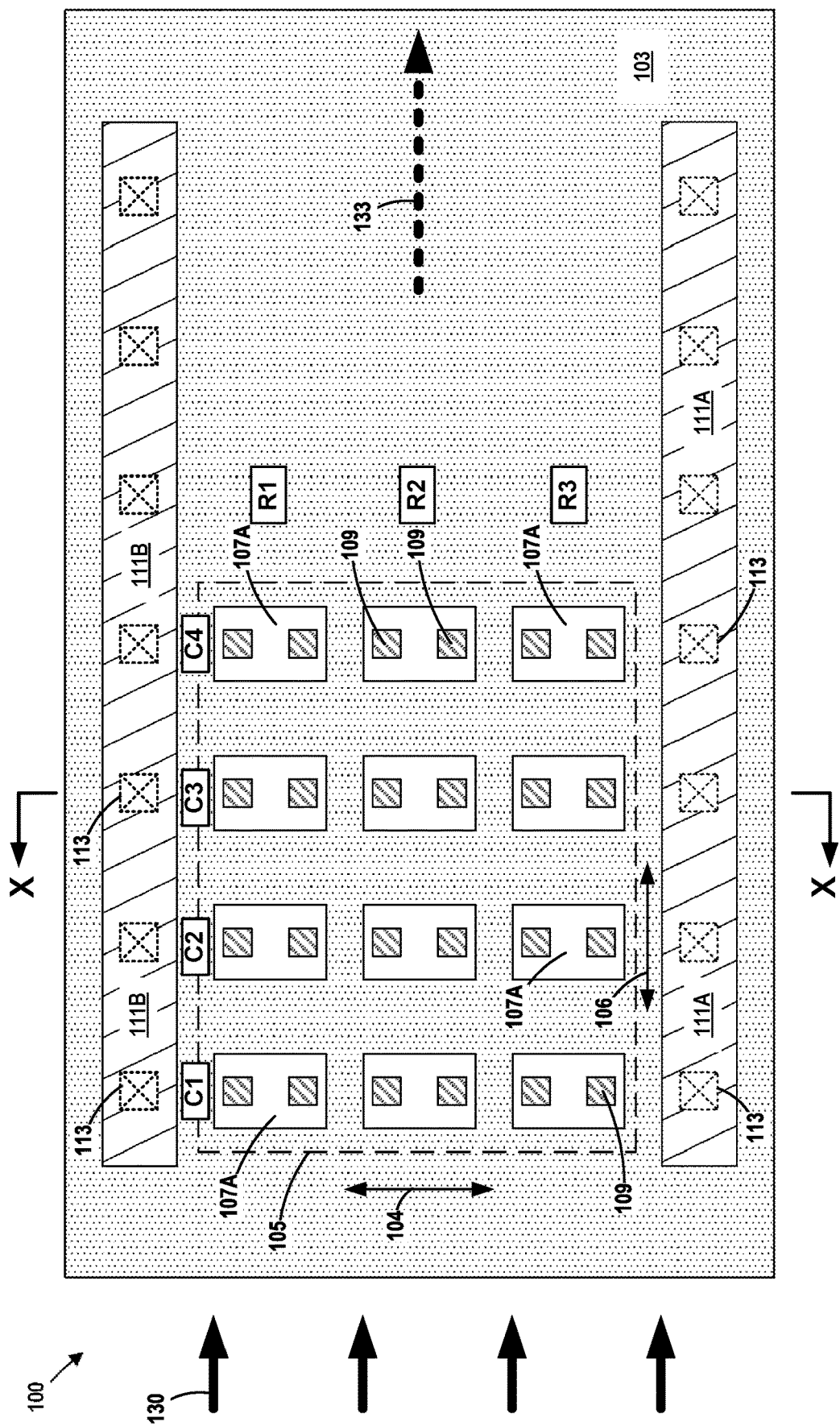

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-22 depict various novel embodiments of a multifunctional metamaterial-based optical device 100 and various novel methods of making such a device. As used herein, a metamaterial will mean a synthetic composite material with a structure that exhibits unique properties. As will be appreciated by those skilled in the art after a complete reading of the present application, the multifunctional optical device 100—a single device—is adapted to perform at least the functions of light coupling, light propagation, light absorption and conversion of light to an electrical current, i.e., photocurrent. The multifunctional optical device 100 may be part of an IC product that comprises optical components and electronic components, such as integrated circuits comprised of CMOS-based field-effect transistors. In other applications, the multifunctional optical device 100 may be part of an IC product that is only dedicated to processing of optical signals.

Figure 3:
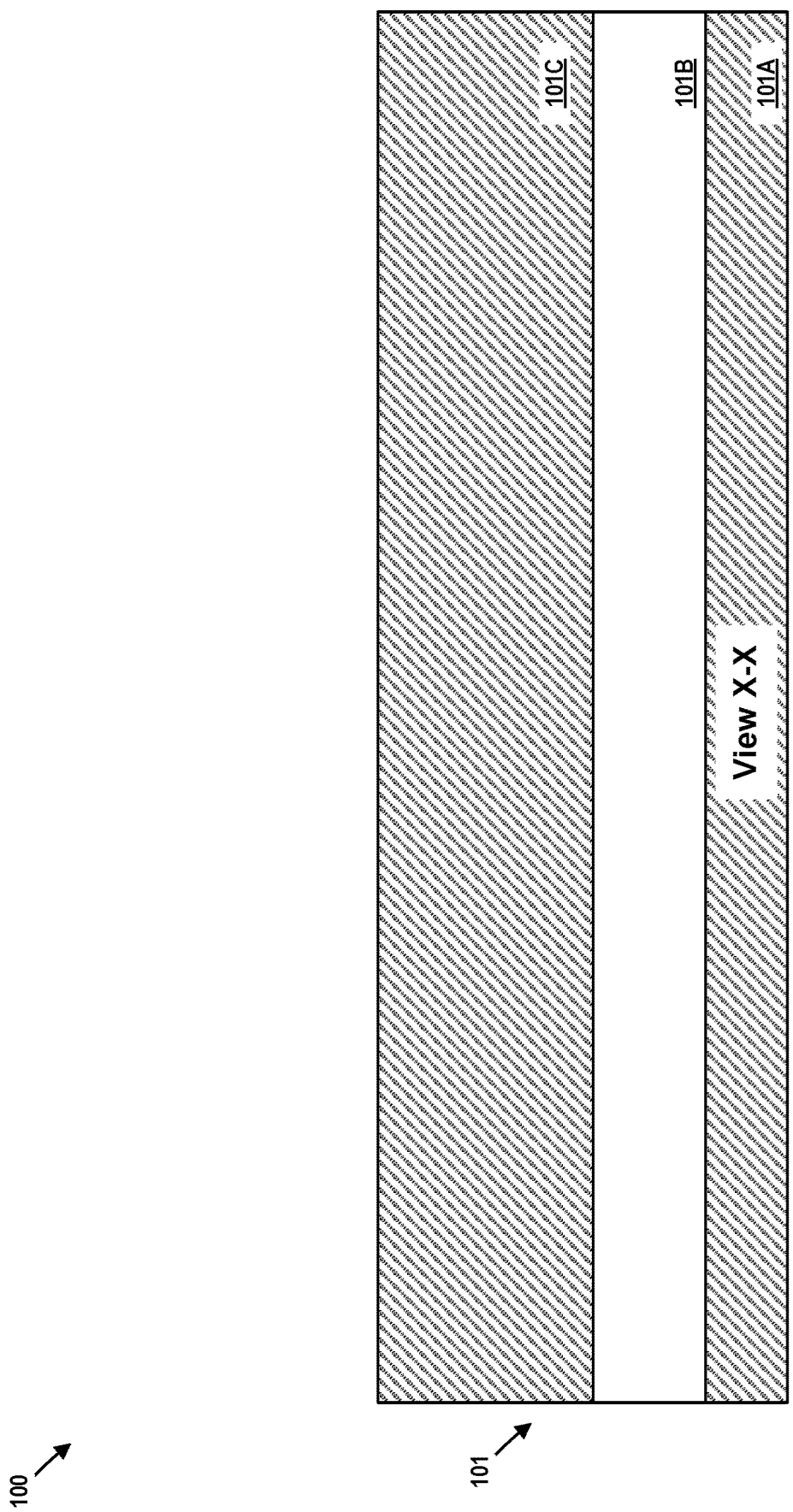

FIG. 1 is a simplistic plan view of the multifunctional optical device 100 at an intermediate stage of fabrication. The location where various cross-sectional views (view X-X) depicted herein is also shown in FIG. 1. With reference to FIG. 3, the multifunctional optical device 100 will be formed above a semiconductor substrate 101. The substrate 101 may have a variety of configurations, such as a semiconductor-on-insulator (SOI) configuration shown in FIG. 3. Such an SOI substrate 101 includes a base semiconductor layer 101A, a buried insulation layer 101B positioned on the base semiconductor layer 101A and an active semiconductor layer 101C positioned above the buried insulation layer 101B, wherein the multifunctional optical device 100 will be formed in and above the active semiconductor layer 101C. The thickness of the active semiconductor layer 101C and the buried insulation layer 101B may vary depending upon the particular application. In one illustrative embodiment, the active semiconductor layer 101C may be substantially free of any appreciable amount of dopant material, i.e., the active semiconductor layer 101C may be an intrinsic semiconductor material. The active semiconductor layer 101C and the base semiconductor layer 101A need not be made of the same semiconductor material, but that may be the case in some applications. In some applications, the active semiconductor layer 101C and the base semiconductor layer 101A may be made of silicon or they may be made of semiconductor materials other than silicon. Thus, the terms "substrate" or "semiconductor substrate" should be understood to cover all semiconductor materials and all forms of such materials. The buried insulation layer 101B may comprise any desired insulating material, e.g., silicon dioxide, silicon nitride, etc.

With reference to FIG. 1, and as will be described more fully below, a layer of insulating material 103, e.g., silicon dioxide, was formed above the upper surface of the active semiconductor layer 101C of the substrate 101. Also simplistically depicted in FIG. 1 is incident light 130 that may irradiate the multifunctional optical device 100. The incident light 130 may come from any source, e.g., a fiber optics cable, a surface mounted laser, etc. In some cases, the incident light 130 may strike the multifunctional optical device 100 at an angle that is substantially normal to the upper surface of the active semiconductor layer 101C of the substrate 101. Also depicted in FIG. 1 is the optical axis 133 of the multifunctional optical device 100. Light 130 propagates through the multifunctional optical device 100 in the direction indicated by the optical axis 133.

In one illustrative example, the multifunctional optical device 100 comprises a photodetector-coupler 105 that is formed above the active semiconductor layer 101C. In the example shown in FIG. 1, the photodetector-coupler 105 comprises an array of individual detector-coupler elements 107A that are arranged in three rows (R1-R3) and four columns (C1-C4). The detector-coupler elements 107A may be comprised of any semiconductor material or compound semiconductor material, e.g., silicon, silicon germanium, germanium, polysilicon, etc. Of course, the number of such detector-coupler elements 107A within the photodetector-coupler 105, as well as the size, configuration, arrangement and materials of construction of the detector-coupler elements 107A, may vary depending upon the particular applications. The detector-coupler elements 107A within the photodetector-coupler 105 may be arranged in an ordered pattern (as depicted in FIG. 1) or they may be arranged with an irregular pattern. The pitch between adjacent columns of the detector-coupler elements 107A need not be the same, but that may be the case in some applications. Moreover, the pitch between all of the columns within the photodetector-coupler 105 need not be constant, but that may be the case in some applications. The spacing (vertical as shown in FIG. 1) between the detector-coupler elements 107A in adjacent rows also need not be the same, but that may be the case in some applications. Moreover, the spacing between all of the rows within the photodetector-coupler 105 need not be constant, but that may be the case in some applications. Each row or column of the detector-coupler elements 107A need not have the same number of detector-coupler elements 107A, but that may be the case in some applications.

The physical dimensions of the detector-coupler elements 107A, e.g., the length (in the direction 104), the width (in the direction 106) and the thickness (in a direction normal to the plane of the drawing page in FIG. 1) may vary depending upon the particular application. Moreover, all of the detector-coupler elements 107A need not have the same physical dimensions, but that may be the case in some applications. In the illustrative example depicted in FIG. 1, all of the detector-coupler elements 107A have the same physical dimensions (in nanometers), wherein the length (in the direction 104) may be about 0.15-0.4 times the wavelength of the incident light 130, the width (in the direction 106) may be about 0.15-0.4 times the wavelength of the incident light 130 and the thickness may be about 0.05-0.7 times the wavelength of the incident light 130. In one illustrative embodiment, the pitch between adjacent columns in the photodetector-coupler 105 may be substantially uniform and it may be about 0.4-0.8 times the wavelength of the incident light 130.

Figure 2:
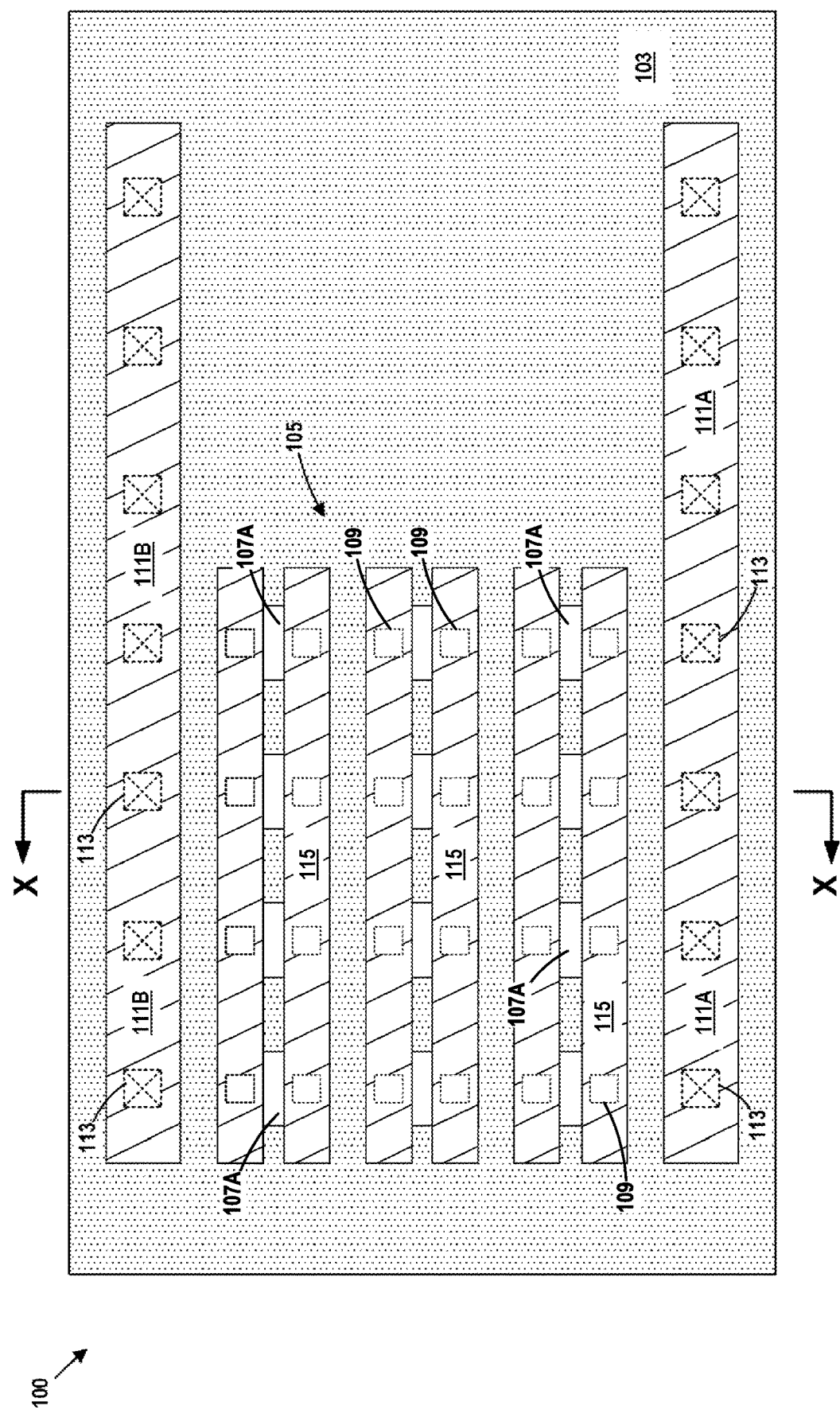

With continued reference to FIG. 1, each of the detector-coupler elements 107A constitutes a diode 108 (e.g., a PIN diode) as described more fully below. Of course, other forms of diodes (e.g., avalanche photodetector, etc.) could be formed in the detector-coupler elements 107A. A pair of conductive contacts 109 are conductively coupled to each of the detector-coupler elements 107A. As will be described more fully below, another diode 110 (e.g., a PIN diode) will be formed in the active semiconductor layer 101C of the substrate 101 under each of the detector-coupler elements 107A. The active semiconductor layer 101C is the base layer 112 of the multifunctional optical device 100. Thus, the multifunctional optical device 100 comprises first and second metal lines 111A, 111B (collectively referenced using the numeral 111) and conductive contacts 113 (shown in dashed lines) that conductively contact outermost doped regions of the plurality of diodes 110 formed in the active semiconductor layer 101C. The remaining contact structures for the diodes 110 in the active semiconductor layer 101C are not depicted in the plan views herein so as not to overly complicate the drawings and so as to facilitate the explanation of the subject matter disclosed herein. FIG. 2 shows a plurality of conductive lines 115 that are conductively coupled to the contacts 109. The conductive lines 115 were not shown in FIG. 1 so as to facilitate explanation of various structures of the multifunctional optical device 100. The conductive lines 111, 115 and the conductive contacts 109, 113 may be comprised of any conductive material and they may be formed by performing a variety of known manufacturing techniques.

FIG. 3 depicts the substrate 101 prior to beginning manufacturing operations in accordance with one illustrative process flow.

Figure 4:
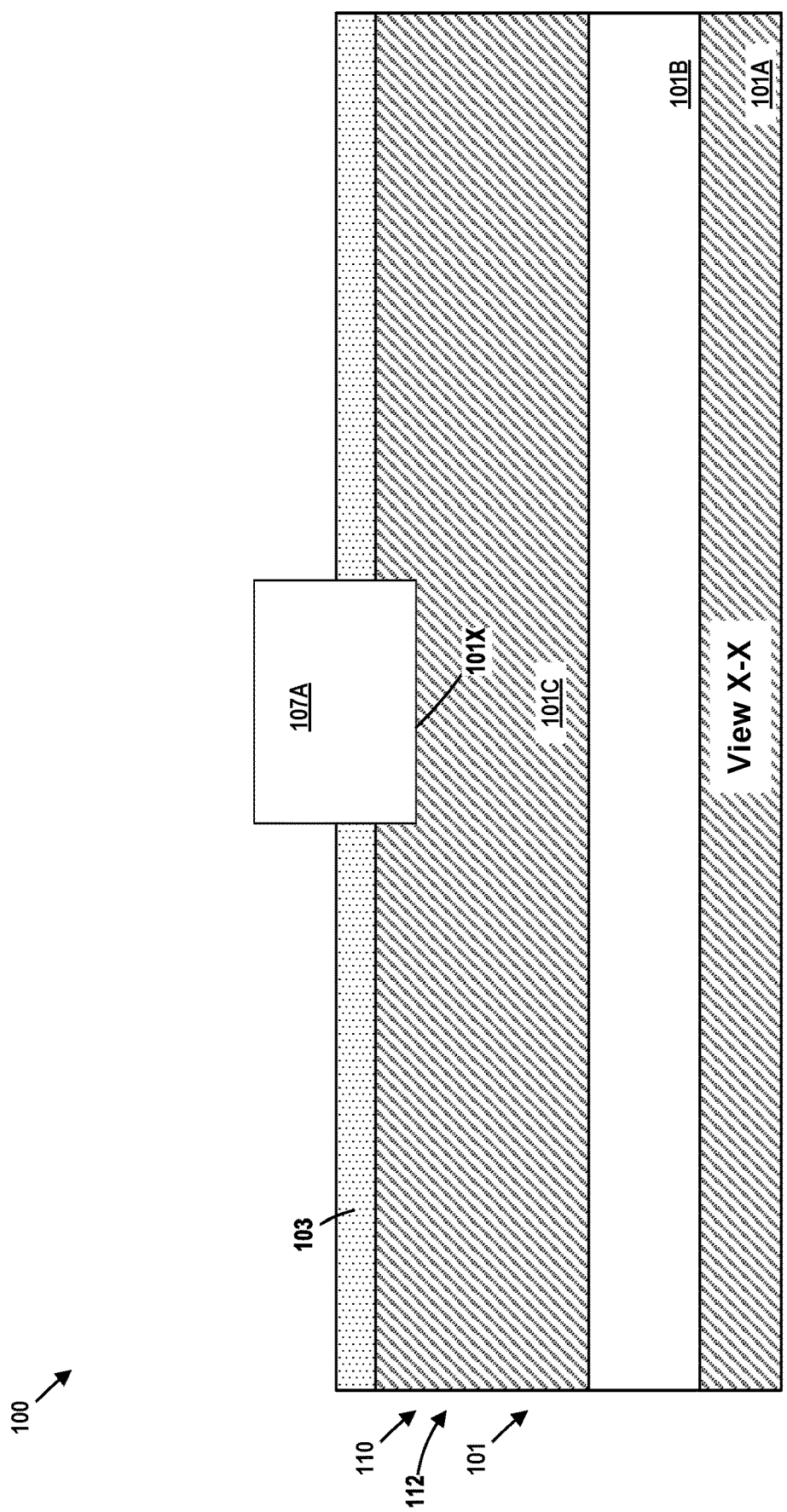
Figure 5:
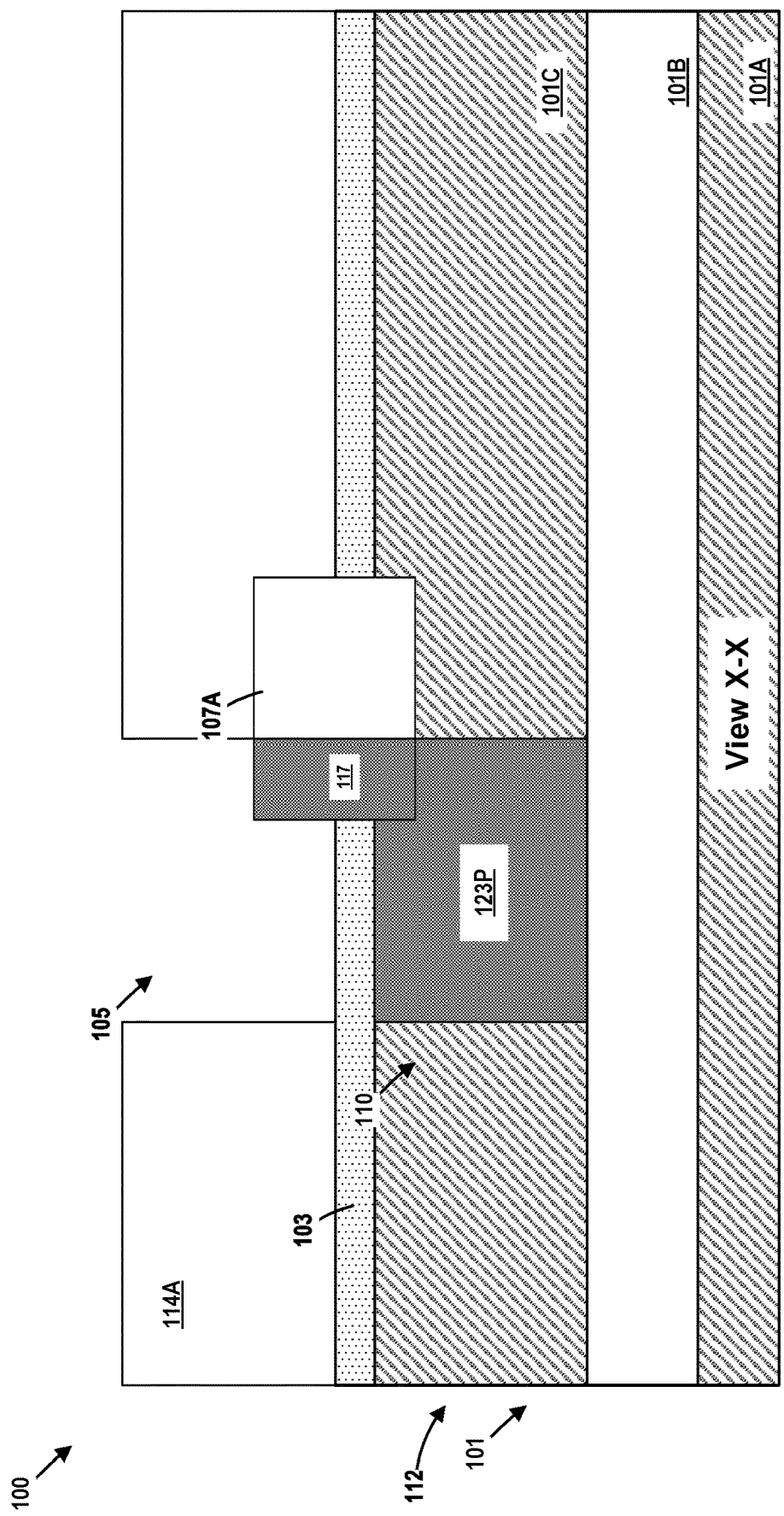
Figure 6:
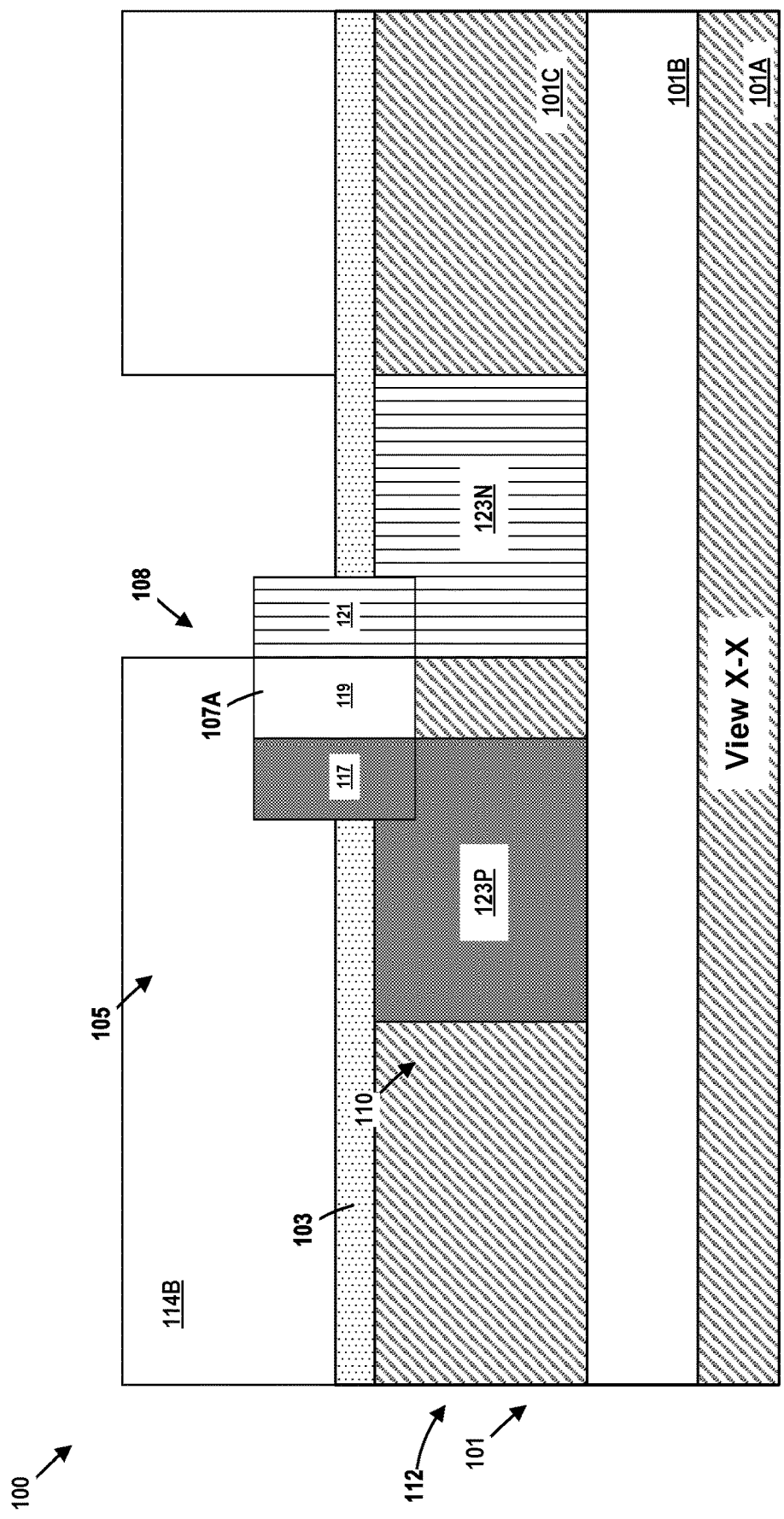

FIG. 4 depicts the multifunctional optical device 100 after several processing operations were performed that ultimately leads to the formation of the detector-coupler elements 107A. In FIGS. 4, 5 and 6, only a single detector-coupler element 107A will be shown so as to facilitate explanation of the subject matter disclosed herein. However, it should be understood that all of the detector-coupler elements 107A may be formed in the same manner. As shown in FIG. 4, a layer of insulating material 103 was blanket deposited across the substrate 101. The layer of insulating material 103 may be comprised of a variety of different materials, e.g., silicon dioxide, and it may be formed to any desired thickness, e.g., 10-100 nm. In the illustrative example depicted herein, the detector-coupler elements 107A are depicted as being formed of an epitaxially grown semiconductor material, e.g., silicon germanium, germanium, etc. Thus, the layer of insulating material 103 was then patterned to expose portions of the active semiconductor layer 101C. The layer of insulating material 103 may be patterned by performing known masking and etching techniques. Thereafter, a trench 101X was formed in the active semiconductor layer 101C. The depth of the trench 101X may vary depending upon the particular application. Then, an epitaxial growth process was performed to form the detector-coupler element 107A in the trench 101X. Of course, the epi material may simply be formed on the exposed portions of the upper surface of the active semiconductor layer 101C, i.e., the formation of the trench 101X may be omitted. In some applications, the detector-coupler elements 107A may be formed of a material such as polysilicon. In that situation, the layer of insulating material 103 need not be patterned and a layer of polysilicon (not shown) may be directly deposited on the upper surface of the layer of insulating material 103 and thereafter patterned to form the detector-coupler elements 107A.

FIGS. 5 and 6 depict the multifunctional optical device 100 after several process operations were performed to form the doped regions of the diode 108 in the detector-coupler element 107A and the diodes 110 in the active semiconductor layer 101C that are positioned at least partially under the detector-coupler elements 107A. The N-doped regions and the P-doped regions of the diode 108, 110 may be formed in any desired order. With reference to FIG. 5, in one illustrative process flow, a first patterned ion implantation mask 114A was formed to expose areas where it is desired to a form P-doped region 117 in the detector-coupler element 107A and a P-doped region 123P in the active semiconductor layer 101C. In one illustrative embodiment, the active semiconductor 101C may be substantially free of dopant material, e.g., an intrinsic semiconductor material. The doped regions 117, 123P may be formed by performing traditional masking and ion implantation techniques. The maximum concentration of dopant atoms in the P-doped regions 117, 123P may vary depending upon the particular application, e.g., 1E18-1E20 ions/cm$^3$. The location of the peak concentration of dopant atoms within the vertical thickness of the doped regions 117, 123P may also vary depending upon the particular application. The lateral width of the P-doped regions 117, 123P may vary depending upon the particular application. The P-doped regions 117, 123P may be doped with any species of P-type dopant, e.g., boron, boron difluoride, etc.

FIG. 6 depicts the multifunctional optical device 100 after several process operations were performed. First, the patterned implant mask 114A was removed. Thereafter, a second patterned ion implantation mask 114B was formed to expose areas where it is desired to form an N-doped region 121 in the detector-coupler element 107A and an N-doped region 123N in the active semiconductor layer 101C. The doped regions 121, 123N may be formed by performing traditional masking and ion implantation techniques. The maximum concentration of dopant atoms in the N-doped regions 121, 123N may vary depending upon the particular application, e.g., 1E18-1E20 ions/cm$^3$. The location of the peak concentration of dopant atoms within the vertical thickness of the doped regions 121, 123N may also vary depending upon the particular application. The lateral width of the N-doped regions 121, 123N may vary depending upon the particular application. The N-doped regions 121, 123N may be doped with any species of N-type dopant, e.g., arsenic, phosphorus, etc. After formation of the N-doped regions 121, 123N, the patterned implant mask 114B may be removed. As depicted, an intrinsic semiconductor region 119 is laterally positioned between the P-doped region 117 and the N-doped region in the detector-coupler element 107A. A portion of the intrinsic active semiconductor layer 101C is laterally positioned between the P-doped region 123P and the N-doped region 123N.

The lateral width of the P-doped regions 117, 123P and the N-doped regions 121, 123N (when viewed in the cross-section shown in FIG. 6), the lateral spacing between the P-doped region 117 and the N-doped region 121, as well as the lateral spacing between the P-doped region 123P and the N-doped region 123N may all vary depending upon the application, e.g., 500-2000 nm, 500-2000 nm, 300-1500 nm, respectively.

Figure 7:
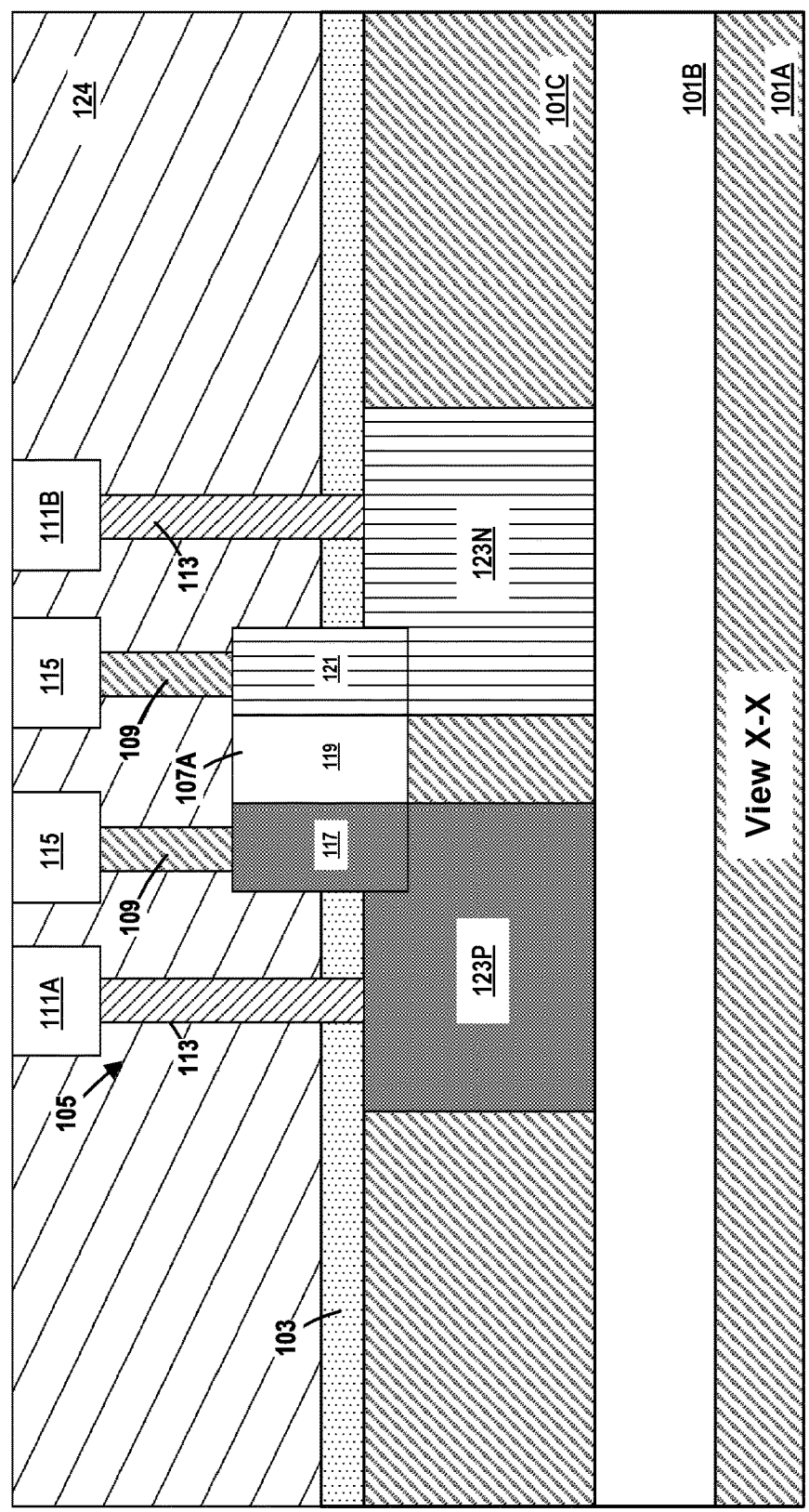

FIG. 7 depicts the multifunctional optical device 100 after several process operations were performed. First, simplistically depicted one or more layers of insulating material 124 were formed above the photodetector structure 100. In a real-world device, the one or more layers of insulating material 124 may comprise multiple layers of material and the layers of material may be made of different materials. For example, the one or more layers of insulating material 124 may comprise one of more layers of silicon dioxide with a layer of silicon nitride (which functions as an etch stop layer) positioned between the layers of silicon dioxide. The structure, composition and techniques used to form such layer(s) of insulating material are well known to those skilled in the art. Thereafter, the above-referenced conductive lines 111, 115 and conductive contacts 109, 113 are formed in the one or more layers of insulating material 124.

The structure, composition and techniques used to form the conductive lines 111, 115 and conductive contacts 109, 113 are well known to those skilled in the art.

Figure 8:
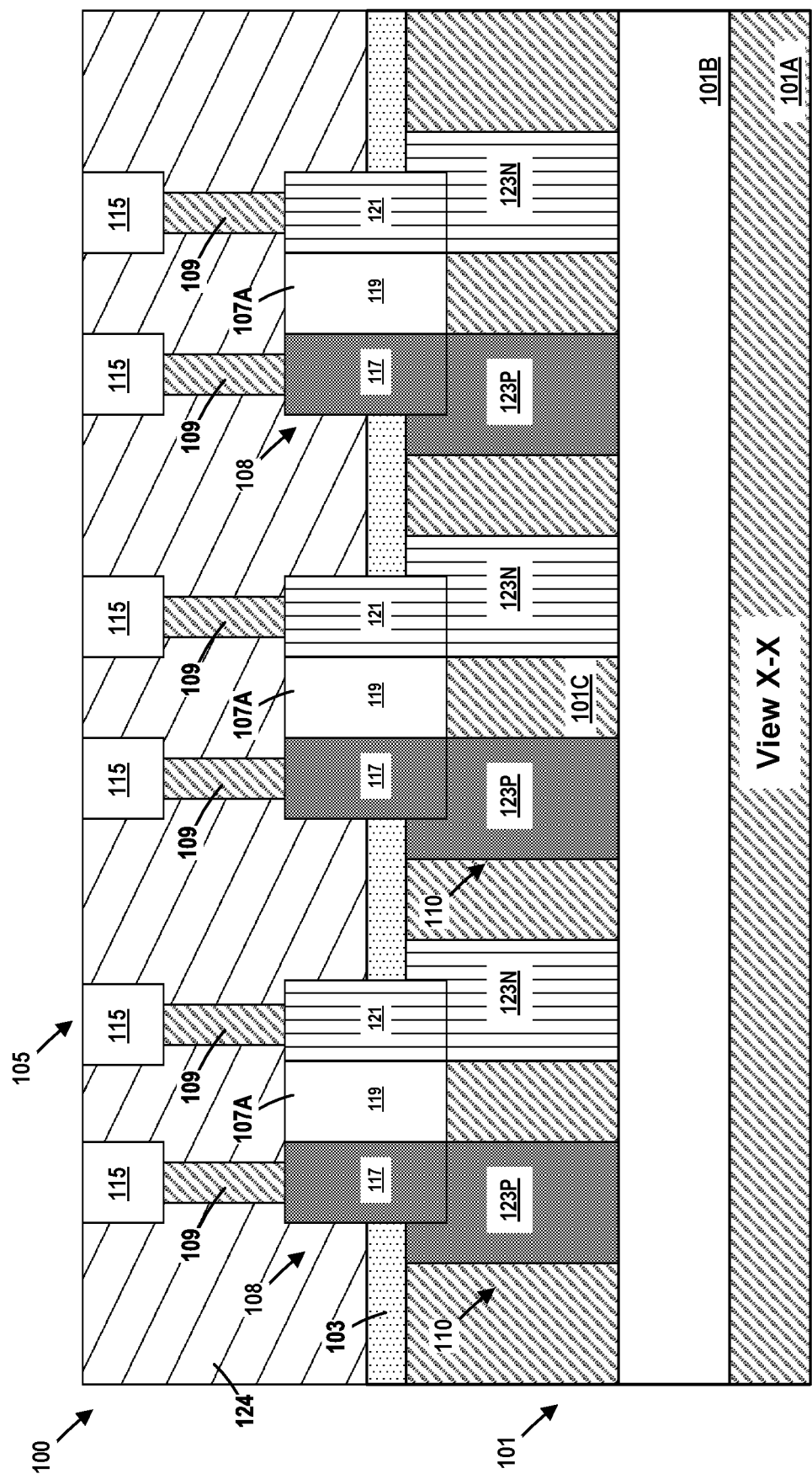

FIG. 8 is a cross-sectional view of the photodetector-coupler 105 showing a plurality of the detector-coupler elements 107A with a diode 108 formed therein and a diode 110 formed in the active semiconductor layer 101C under each of the detector-coupler elements 107A. The lateral width of the P-doped region 123P and the N-doped region 123N has been reduced in FIG. 8. No attempt has been made in FIG. 8 to show the conductive contacts lines 111 and conductive contacts 113 that are formed to contact the P-doped regions 123P and the N-doped regions 123N of the diodes 110.

Figure 9:
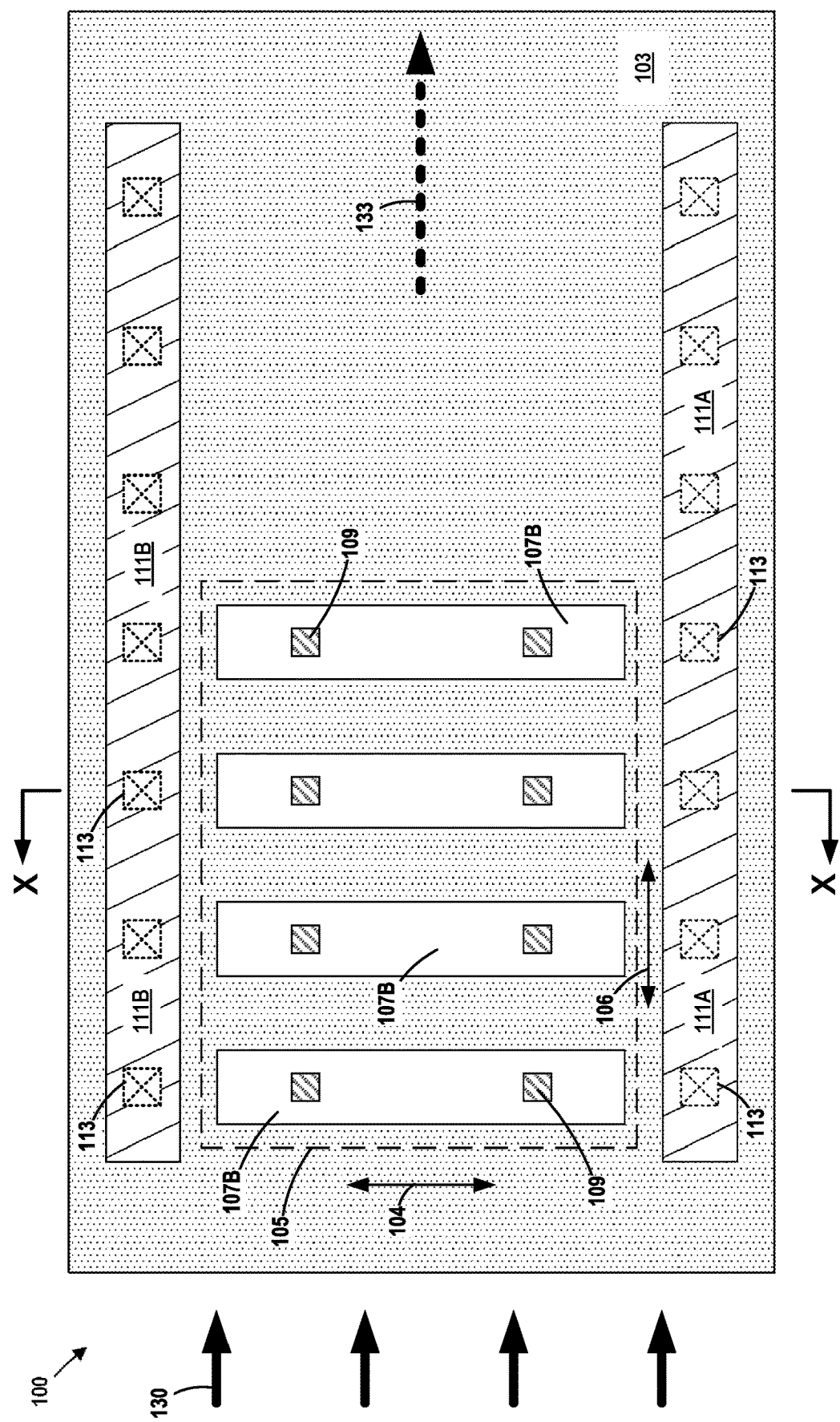
Figure 10:
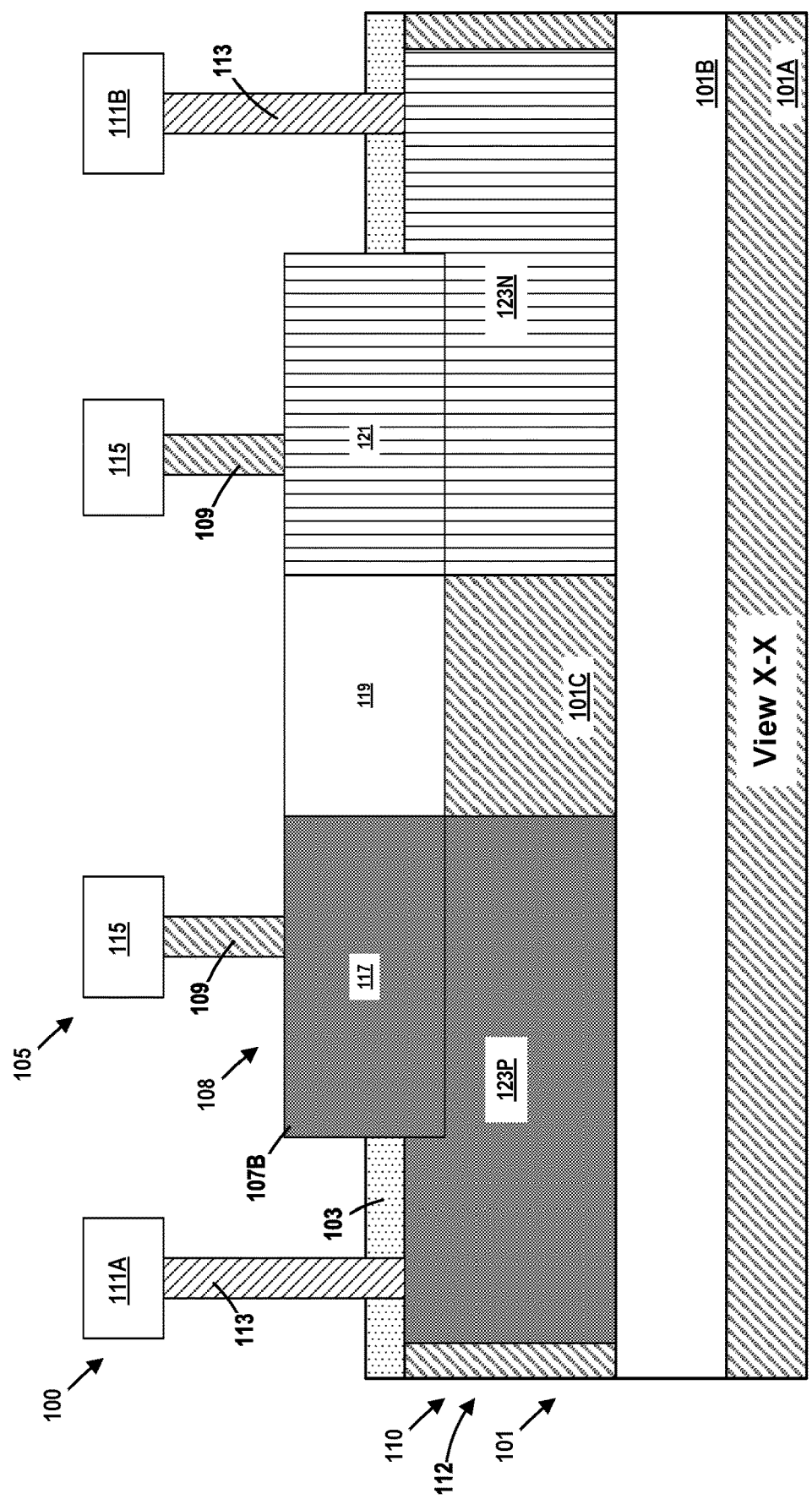
Figure 11:
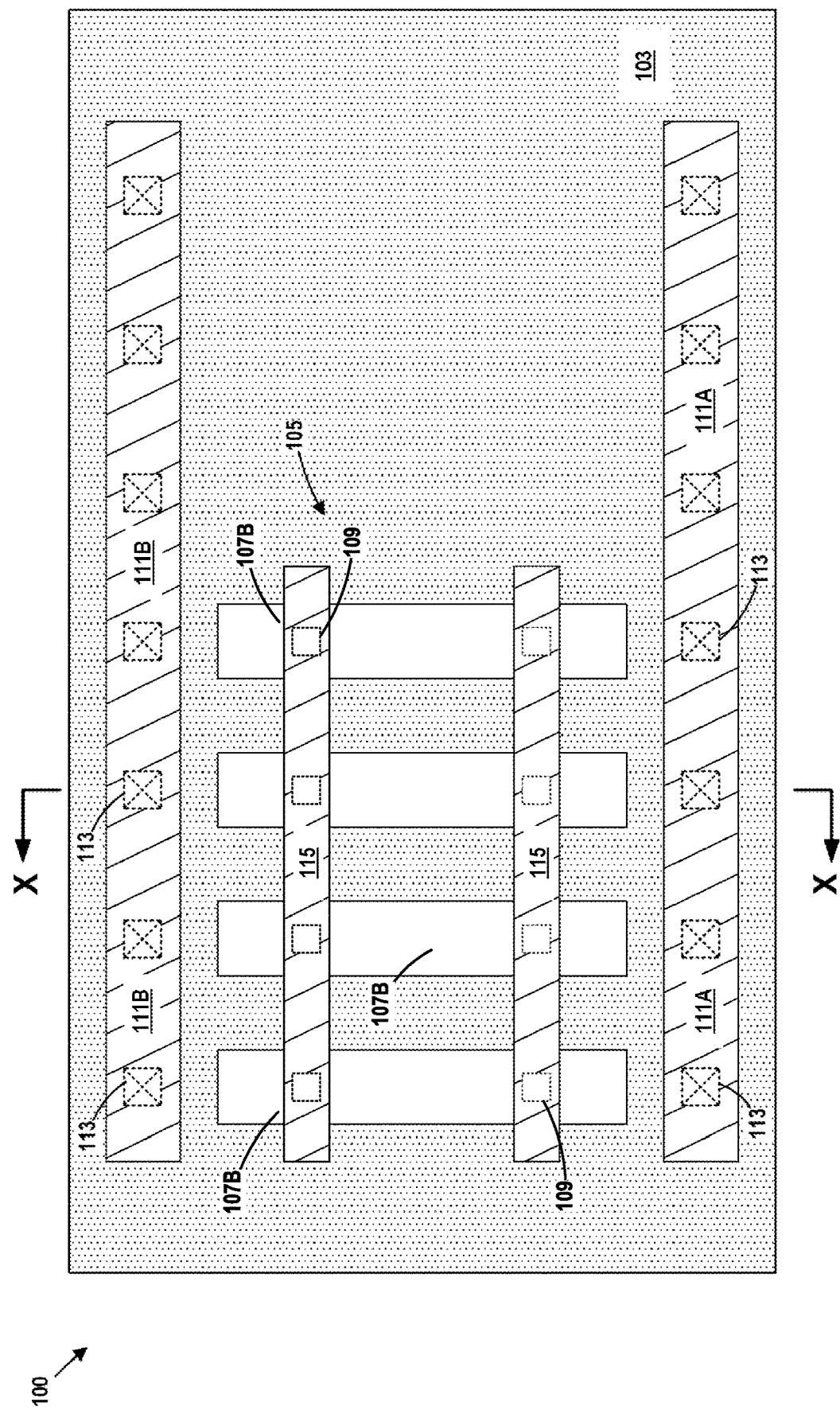

FIGS. 9-11 depict an alternative embodiment of the multifunctional optical device 100 wherein each column of the detector-coupler elements 107A shown in FIG. 1 has been replaced with a single layer of material that functions as detector-coupler elements 107B for the photodetector-coupler 105. The plurality of the detector-coupler elements 107B are continuous structures arranged in a plurality of columns wherein a long axis of each of the plurality of detector-coupler elements 107B is oriented substantially transverse to the optical axis 133 of the multifunctional optical device 100. The detector-coupler elements 107A and the detector-coupler elements 107B will be collectively referenced using the numeral 107. Of course, the number of such detector-coupler elements 107B within the photodetector-coupler 105 as well as the size, configuration, arrangement and materials of construction of the detector-coupler elements 107B may vary depending upon the particular applications. The detector-coupler elements 107B within the photodetector-coupler 105 may be arranged in an ordered pattern (as depicted in FIG. 9) or they may be arranged with an irregular pattern. The pitch between adjacent detector-coupler elements 107B need not be the same, but that may be the case in some applications. Moreover, the pitch between all of the detector-coupler elements 107B need not be constant, but that may be the case in some applications.

As with the physical dimensions of the detector-coupler elements 107A, the physical dimensions of the detector-coupler elements 107B, e.g., the length (in the direction 104), the width (in the direction 106) and the thickness (in a direction normal to the plane of the drawing page in FIG. 9) may vary depending upon the particular application. Moreover, all of the detector-coupler elements 107B need not have the same physical dimensions, but that may be the case in some applications. In the illustrative example depicted in FIG. 9, all of the detector-coupler elements 107B have the same physical dimensions (in nanometers), wherein the length (in the direction 104) may be about 0.15-0.4 times the wavelength of the incident light 130, the width (in the direction 106) may be about 0.15-0.4 times the wavelength of the incident light 130 and the thickness may be about 0.05-0.7 times the wavelength of the incident light 130. In one illustrative embodiment, the pitch between the detector-coupler elements 107B in the photodetector-coupler 105 may be substantially uniform and it may be about 0.4-0.8 times the wavelength of the incident light 130.

As with the detector-coupler elements 107A, and as shown in FIG. 10, each of the detector-coupler elements 107B constitutes a diode 108 (e.g., a PIN diode), e.g., an above-described P-doped region 117 and an above-described N-doped region 121 separated by the above-described intrinsic region 119. Of course, other forms of diodes (e.g., avalanche photodetector, etc.) could be formed in the detector-coupler elements 107B. A pair of conductive contacts 109 are conductively coupled to the diode 108 in each of the detector-coupler elements 107B. As shown in FIG. 10, a diode 110 (e.g., a PIN diode) comprised of the above-described P-doped region 123P and the N-doped region 123N was formed in the active semiconductor layer 101C of the substrate 101. Thus, FIGS. 9-11 depict the above-described first and second metal lines 111A, 111B and conductive contacts 113 that conductively contact the separate P-doped region 123P and the N-doped region 123N of the diode 110 in the active semiconductor layer 101C. FIG. 11 shows a plurality of conductive lines 115 that are conductively coupled to the contacts 109. The conductive lines 115 were not shown in FIG. 9 so as to facilitate explanation of various structures of this illustrative embodiment of the multifunctional optical device 100.

Figure 12:
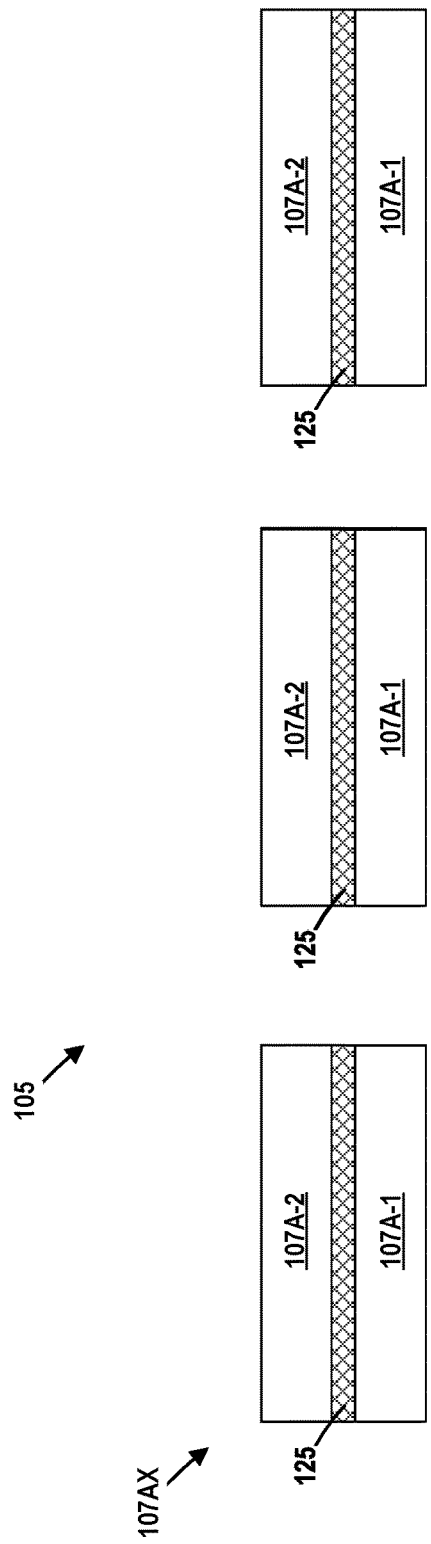
Figure 13:
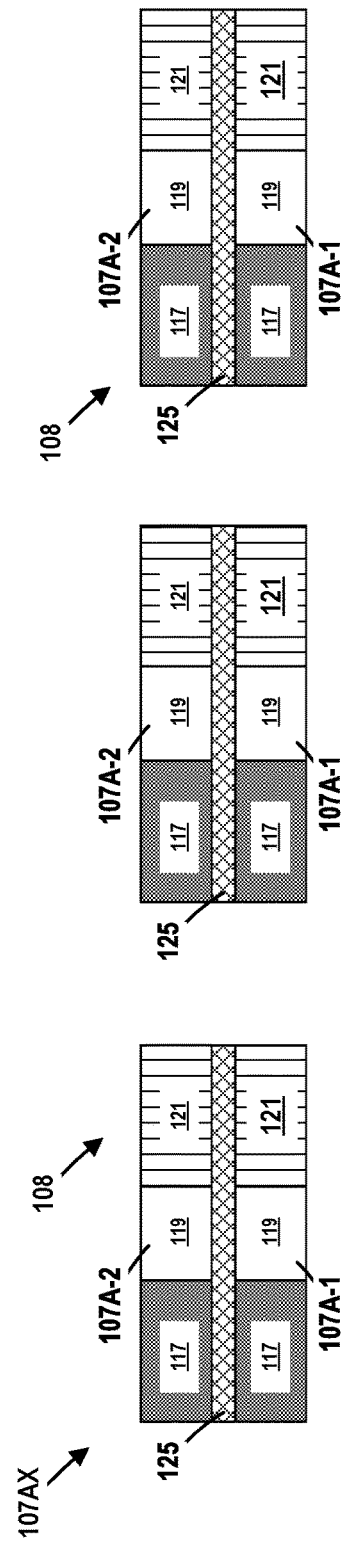

The detector-coupler elements 107 disclosed herein may also have a multi-layer configuration, wherein the multi-layer configuration is designated by use of the suffix "X". FIGS. 12 and 13 are side views of the detector-coupler elements 107A having this multi-layer configuration. FIG. 12 depicts the multi-layer detector-coupler elements 107AX without the P-doped region 117 and the N-doped region 121 of the diodes 108, while FIG. 13 depicts the multi-layer detector-coupler elements 107AX with the P-doped region 117 and the N-doped region 121 of the diodes 108. With reference to FIG. 12, each of the multi-layer detector-coupler elements 107AX comprises a first layer 107A-1 and a second layer 107A-2 separated by a layer of insulating material 125, e.g., silicon dioxide. In one aspect, the multi-layer detector-coupler elements 107AX may be simply viewed as a bottom array of the detector-coupler elements 107A separated from a top array of the detector-coupler elements 107A by the insulating material 125. Conductive contacts (not shown) to conductively contact the multi-layer version of the detector-coupler elements 107A would extend through the second layer 107A-2 and the layer of insulating material 125 and stop on the first layer 107A-1.

In one illustrative process flow, the first layer 107A-1 may be formed by patterning the insulating material 103 (not shown) to expose portions of the active semiconductor layer 101C and thereafter performing an epitaxial growth process to form separate regions of epitaxial semiconductor material on the exposed portions of the active semiconductor layer 101C. Thereafter, the insulating material 125 and the material for the second layer 107A-2 (e.g., polysilicon) were formed above the layer of insulating material 125 by depositing the various layers of material, forming a patterned etch mask (not shown) above the second layer 107A-2 and performing one or more anisotropic etching processes to remove exposed portions of the material for the second layer 107A-2 and the layer of insulating material 125. Thereafter, the P-doped region 117 and the N-doped region 121 of the above-described diodes 108 can be formed in each of the first layer 107A-1 and the second layer 107A-2 as well as the P-doped region 123P (not shown) and the N-doped region 123N (not shown) for the above-described diode 110 may be formed in the active semiconductor layer 101C (not shown) at the same time as the P-doped region 117 and the N-doped region 121 are formed for the diodes 108 by performing the masking and implant techniques described above. The active semiconductor layer 101C and the diodes 110 formed therein are not depicted in FIGS. 12 and 13.

FIGS. 14 and 15 are side views of another variation of the detector-coupler element 107B having this multi-layer configuration. FIG. 14 depicts the multi-layer detector-coupler element 107BX without the P-doped region 117 and the N-doped region 121, while FIG. 15 depicts the multi-layer detector-coupler element 107BX with the P-doped region 117 and the N-doped region 121 of the diode 108. With reference to FIG. 14, the multi-layer detector-coupler element 107BX comprises a first layer 107B-1 and a second layer 107B-2 separated by the layer of insulating material 125, e.g., silicon dioxide. In one aspect, the multi-layer detector-coupler element 107BX may be simply viewed as a bottom detector-coupler element 107B separated from a top detector-coupler element 107B by the insulating material 125. The multi-layer detector-coupler element 107BX may be fabricated using the process flow described above for the multi-layer detector-coupler elements 107AX. The active semiconductor layer 101C and the diode 110 formed therein are not depicted in FIGS. 14 and 15.

Figure 16:
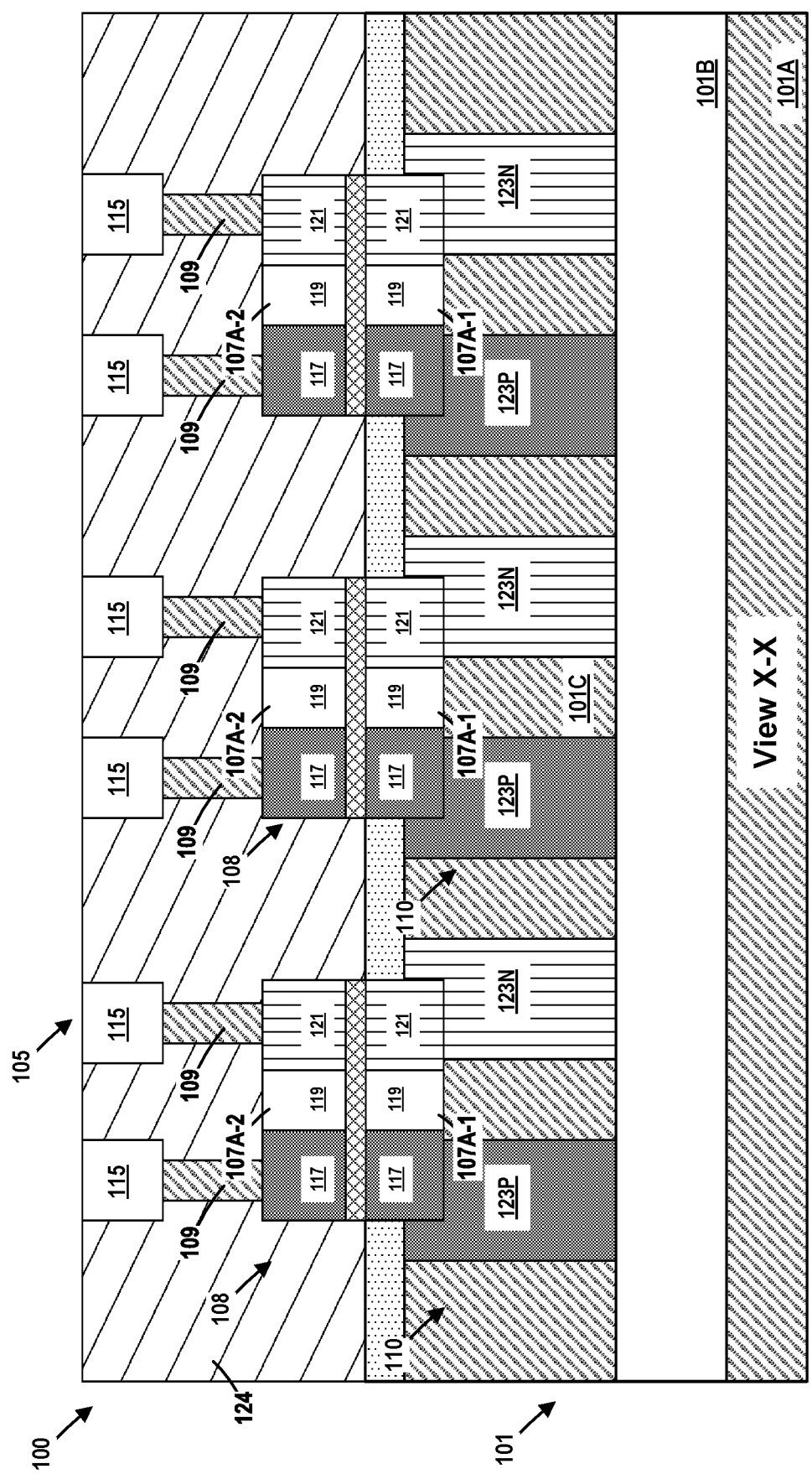

FIG. 16 depicts an embodiment of the multifunctional optical device 100 wherein each column of the detector-coupler elements 107A shown in FIG. 1 has been replaced with the multi-layer detector-coupler elements 107AX. The lateral width of the P-doped regions 123P and the N-doped regions 123N has been reduced in FIG. 16. No attempt has been made in FIG. 16 to show the conductive contacts lines 111 and conductive contacts 113 that are formed to contact the P-doped regions 123P and the N-doped regions 123N of the diodes 110.

Figure 17:
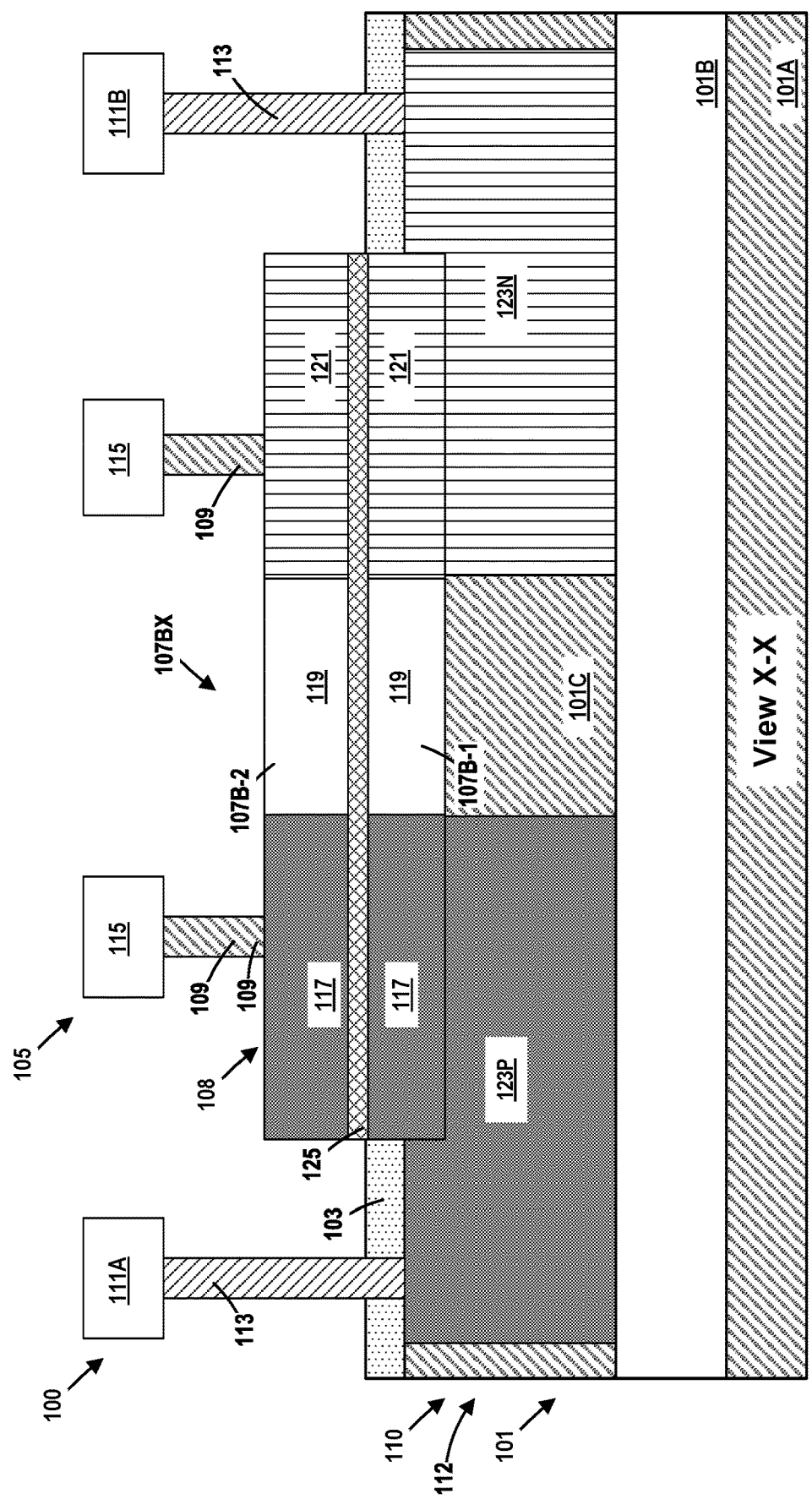

FIG. 17 depicts an embodiment of the multifunctional optical device 100 wherein each of the detector-coupler elements 107B shown in FIG. 9 has been replaced with a multi-layer detector-coupler element 107BX. The reference numeral 107 should also be understood to include the multi-layer detector-coupler elements 107AX and the multi-layer detector-coupler elements 107BX.

Figure 18:
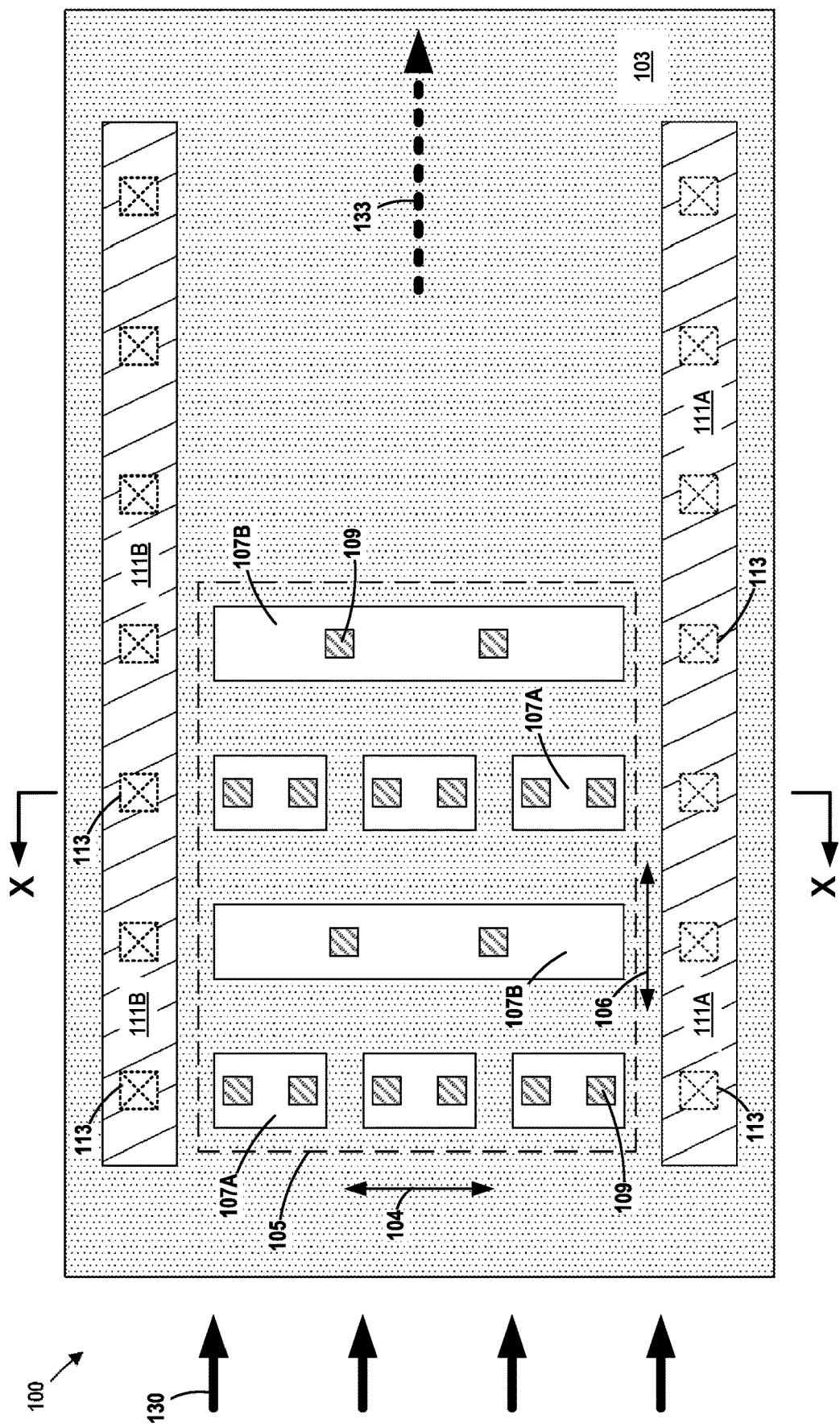
Figure 19:
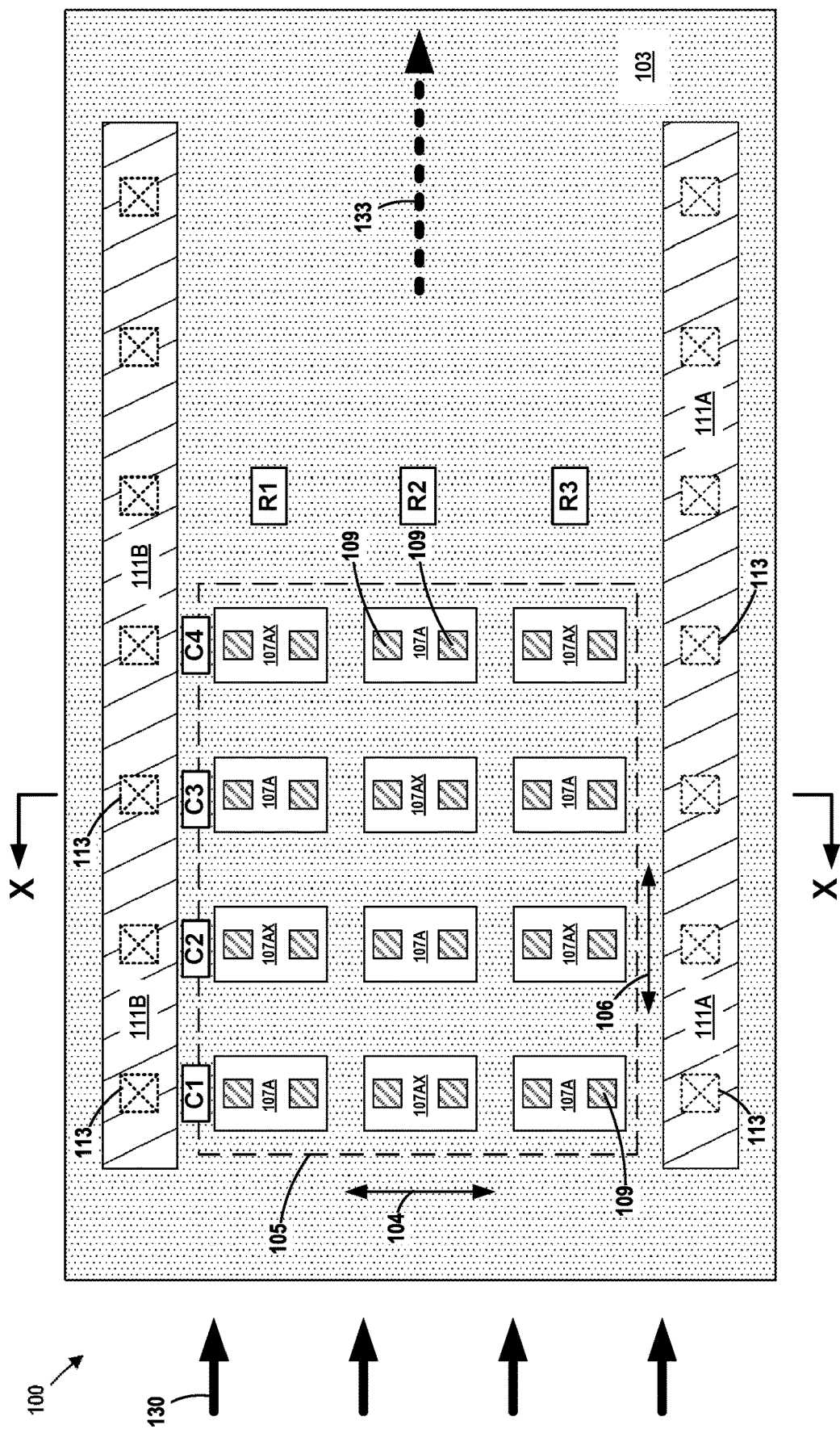

As will be appreciated by those skilled in the art after a complete reading of the present application, the photodetector-coupler 105 may comprise any combination or arrangement of the detector-coupler elements 107A (shown in FIG. 1), the detector-coupler elements 107B (shown in FIG. 9), the multi-layer detector-coupler elements 107AX (shown in FIG. 16) and/or the multi-layer detector-coupler element 107BX (shown in FIG. 17). For example, FIG. 18 depicts an embodiment wherein the photodetector-coupler 105 comprises a plurality of the detector-coupler elements 107A and a plurality of the detector-coupler elements 107B. FIG. 19 depicts an embodiment wherein each of the rows of the photodetector-coupler 105 comprises a plurality of the detector-coupler elements 107A and a plurality of the multi-layer detector-coupler elements 107AX. Other combinations and arrangements will be apparent to those skilled in the art after having benefit of the present application.

Figure 20:
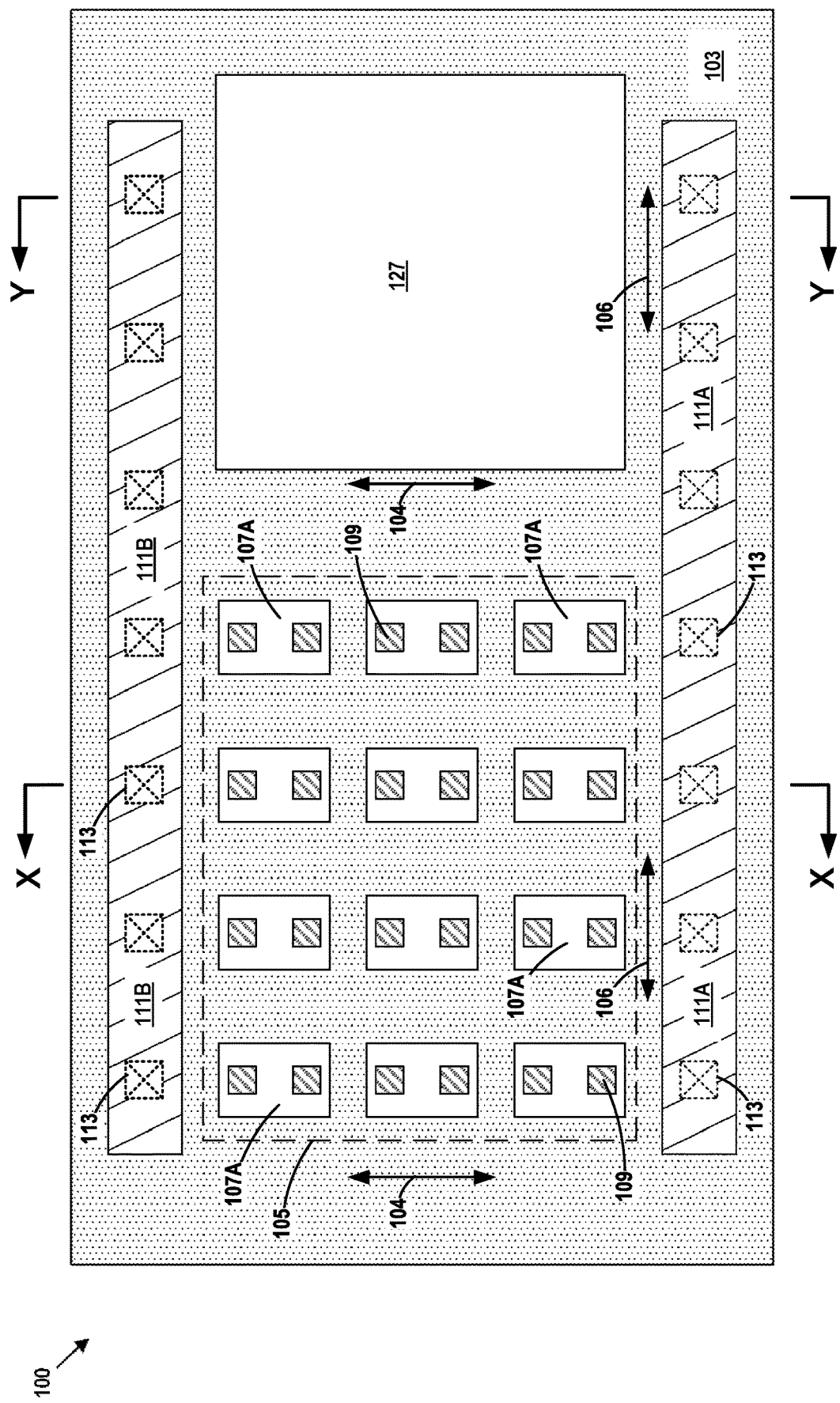

FIG. 20 is a simplistic plan view of another embodiment of the multifunctional optical device 100 disclosed herein at an intermediate stage of fabrication. The multifunctional optical device 100 shown in FIG. 20 is the same as the embodiment shown in FIG. 1 except that an absorber/detector structure 127 was formed above the layer of insulating material 103 downstream (relative to the direction of light propagation) of the photodetector-coupler 105. However, it should be understood that the absorber/detector structure 127 is optional and need not be present in all embodiments of the multifunctional optical device 100 disclosed herein. The location where various cross-sectional views (view Y-Y) of the absorber/detector structure 127 depicted herein is also shown in FIG. 20.

Figure 21:
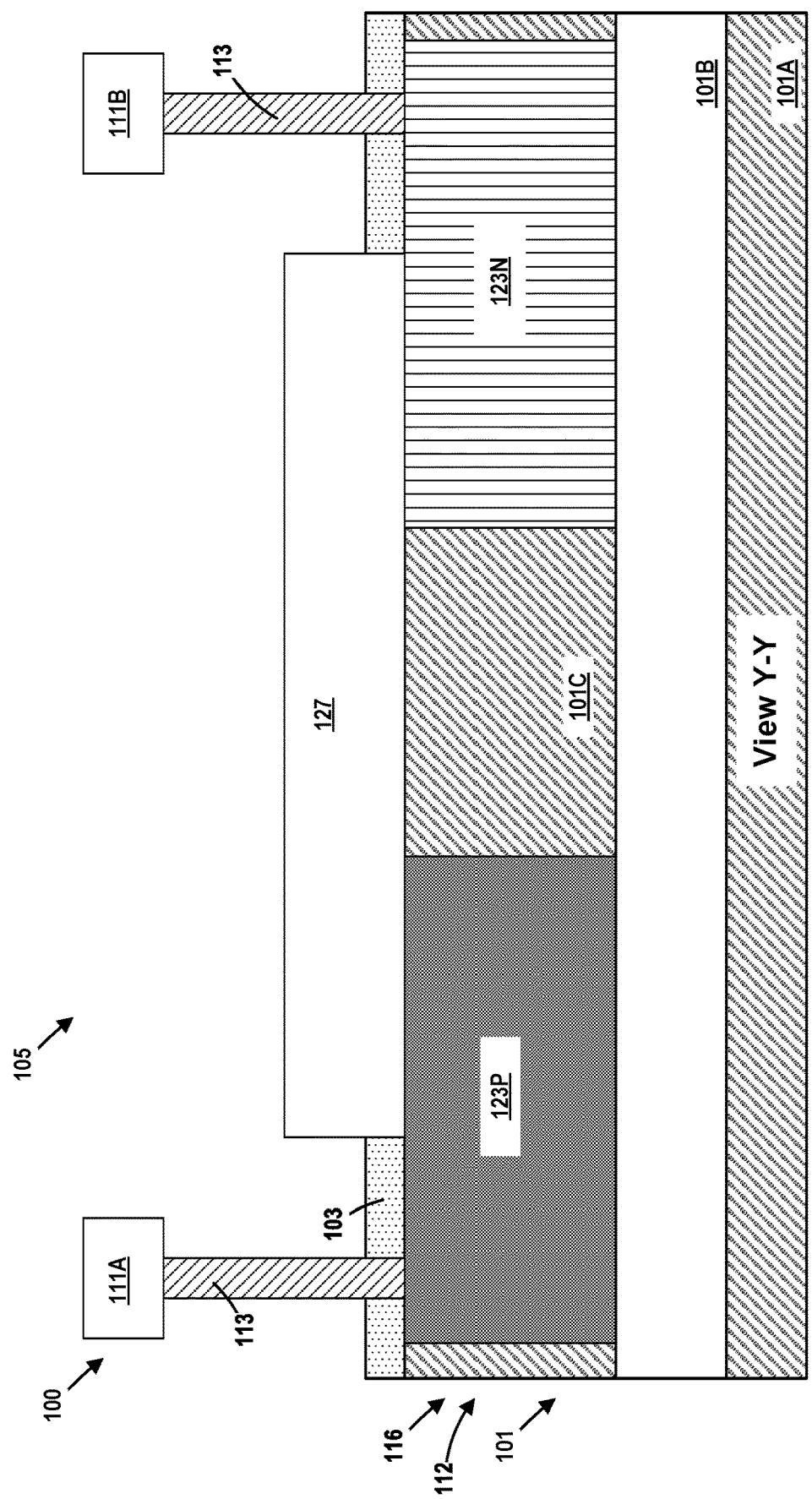

As shown in FIG. 21, in one embodiment, the absorber/detector structure 127 is substantially free of any dopant materials and no conductive contacts are formed to the absorber/detector structure 127. The absorber/detector structure 127 may be comprised of a variety of different materials, e.g., silicon nitride, silicon, germanium, polysilicon, etc. In this example, the absorber/detector structure 127 functions as an absorber that directs light to another diode 116 formed in the base layer 112—the active semiconductor layer 101C—beneath the absorber/detector structure 127. The P-doped region 123P and the N-doped region 123N for the diode 116 may be formed at the same time as the doped regions for the diodes 108 and 110 of the photodetector-coupler 105 are formed.

Figure 22:
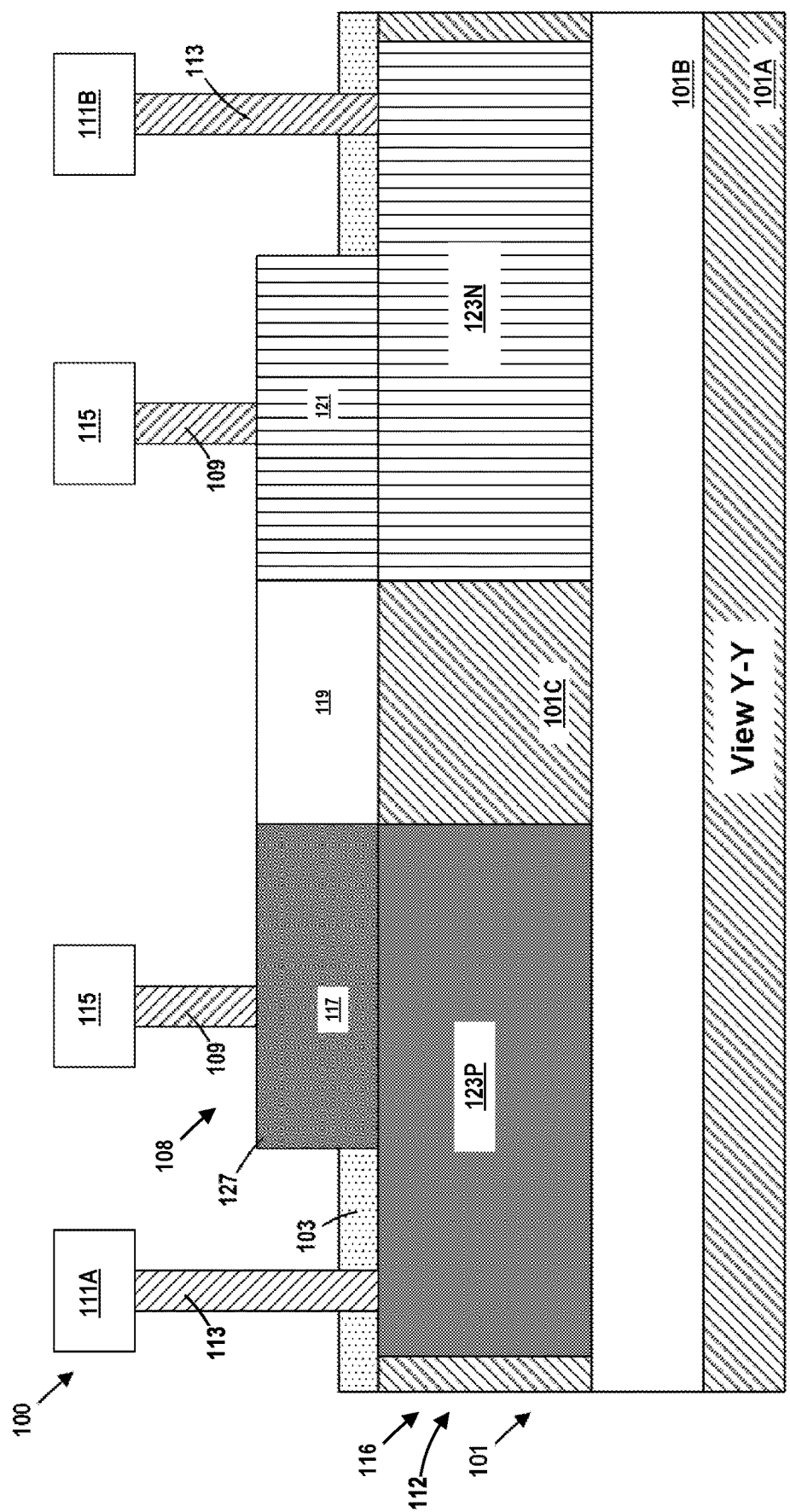

As shown in FIG. 22, in another embodiment, a PIN diode 108 (comprised of the above-described P-doped region 117 and the above-described N-doped region 121 separated by the above-described intrinsic region 119) may be formed in the absorber/detector structure 127 and conductive contacts 109 and conductive lines 115 may be formed to conductively contact the doped regions in the absorber/detector structure 127. In this situation, the absorber/detector structure 127 may be comprised of a semiconductor material, e.g., germanium, silicon, silicon germanium, polysilicon, etc. Of course, other forms of diodes (e.g., avalanche photodetector, etc.) could be formed in the absorber/detector structure 127. In this arrangement, the absorber/detector structure 127 functions as a photodetector whereby at least some portion of the light that impacts the absorber/detector structure 127 is converted to photocurrent.

The physical dimensions of the absorber/detector structure 127, e.g., the length (in the direction 104), the width (in the direction 106) and the thickness (in a direction normal to the plane of the drawing page in FIG. 20) may vary depending upon the particular application. In the illustrative example depicted in FIG. 20, the absorber/detector structure 127 has a length (in the direction 104) that may be about 1-20 times the wavelength of the incident light 130, a width (in the direction 106) that may be about 0.8-5 times the wavelength of the incident light 130 and a thickness that may be about 0.05-1 times the wavelength of the incident light 130.

With respect to materials of construction for the detector-coupler elements 107 in the photodetector-coupler 105—the detector-coupler elements 107A, the detector-coupler elements 107B, the layers 107A-1 and 107A-2 of the multi-layer detector-coupler elements 107AX and the layers 107B-1 and 107B-2 of the multi-layer detector-coupler elements 107BX—and the absorber/detector structure 127 may be comprised of a variety of different semiconductor materials, e.g., silicon, polysilicon, germanium, silicon germanium, etc. Moreover, the material of construction for all of these structures need not be the same, but that may be the case in some applications. For example, in one illustrative example, where the multifunctional optical device 100 will be exposed to incident light having a wavelength of 1.5 µm or greater, the detector-coupler elements 107 in the photodetector-coupler 105 and, if present, the absorber/detector structure 127 may be comprised of substantially pure germanium. In another illustrative example, where the multifunctional optical device 100 will be exposed to incident light having a wavelength of less than 1.5 µm, the detector-coupler elements 107, and, if present, the absorber/detector structure 127 may be comprised of polysilicon or substantially pure silicon. In other cases, the detector-coupler elements 107 in the photodetector-coupler 105 may be comprised of different materials, e.g., a first plurality of the detector-coupler elements 107 may comprise germanium while a second plurality of the detector-coupler elements 107 may be comprised of silicon. Similarly, the detector-coupler elements 107 in the photodetector-coupler 105 may be comprised of a first material, while the absorber/detector structure 127 (if present) may be made of a second material that is different from the first material.

If a device or product contains multiple numbers of the multifunctional optical devices 100 disclosed herein formed above a single substrate 101, the optical axis 133 of each of the multifunctional optical devices 100 may be oriented in any direction relative to the optical axis 133 of the other multifunctional optical devices 100 on the substrate 101. For example, all of the multifunctional optical devices 100 may be formed on the substrate 101 such that the optical axis 133 of all of the multifunctional optical devices 100 are oriented substantially parallel to one another. In another embodiment, the optical axis 133 of some of the multifunctional optical devices 100 may be oriented substantially perpendicular to the optical axis 133 of other multifunctional optical devices 100 formed above the substrate 101. In short, the optical axis 133 of any multifunctional optical device 100 disclosed herein may have any relevant orientation of the optical axis 133 of any other multifunctional optical device 100, substantially perpendicular, substantially parallel, an obtuse angle, an acute angle, etc. Moreover, in some embodiments, a plurality of the multifunctional optical devices 100 may be arranged in an overall circular pattern with the optical axis 133 of all of the multifunctional optical devices 100 facing radially inward or radially outward. In this particular example, the detector-coupler elements 107 would have an arcuate shape.

As noted above, the multifunctional optical device 100 disclosed herein is a single device that is capable of performing at least the functions of light coupling, light propagation, light absorption and conversion of light to an electrical current, i.e., photocurrent. For example, the photodetector-coupler 105 functions as a coupler with respect to the incident light 130 and also converts some portion of the incident light 130 into electrical current. The detector-coupler elements 107 in the photodetector-coupler 105 also provide a means for the incident light 130 to propagate along the optical axis 133 of the multifunctional optical device 100. A portion of the incident light 130 that is not absorbed by the photodetector-coupler 105 passes through the insulation layer 103 to the diodes 110 in the base layer 112—the active semiconductor layer 101C—of the multifunctional optical device 100 where some portion of that light is converted to electrical current. The base layer 112 of the multifunctional optical device 100 also performs the function of a waveguide that permits a portion of the incident light 130 to propagate within the base layer 112 along the optical axis 133 of the multifunctional optical device 100.

In the case where the multifunctional optical device 100 includes the absorber/detector structure 127, as noted above, the absorber/detector structure 127 may function as an absorber or a photodetector. In the case where the absorber/detector structure 127 does not have a diode formed therein and is not conductively contacted, it functions as an absorber of the portion of the incident light 130 that passes through the photodetector-coupler 105 above the layer of insulation material 103. Some of the light absorbed by the absorber structure 127 is directed toward the diode 116 in the base layer 112 of the multifunctional optical device 100 where some portion of that light is converted to electrical current. The absorber structure 127 of the multifunctional optical device 100 also performs the function of a waveguide that permits a portion of the incident light 130 that passes through the photodetector-coupler 105 to propagate within the absorber structure 127 along the optical axis 133 of the multifunctional optical device 100. In the case where the absorber/detector structure 127 functions as a photodetector, the photodetector structure 127 performs the additional function of converting at least some of the light it absorbs to electrical current. The absorber/detector structure 127—when acting as a photodetector—also functions as a waveguide for at least the portion of the light it absorbs but does not convert to electrical current.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An optical device, comprising:
   a base layer comprising a semiconductor material;
   a photodetector-coupler comprising a detector-coupler element;
   a first diode structure positioned in the detector-coupler element; and
   a second diode structure positioned in the base layer, wherein the second diode structure is positioned vertically below at least a portion of the detector-coupler element.

2. The optical device of claim 1, wherein the semiconductor material is an active semiconductor layer of a semiconductor-on-insulator (SOI) structure.

3. The optical device of claim 1, wherein the detector-coupler element physically contacts a surface of the base layer.

4. The optical device of claim 1, wherein the first diode structure comprises a first doped region and a second doped region and wherein the second diode structure comprises a third doped region and a fourth doped region, wherein the optical device further comprises:
   a first conductive contact that conductively contacts the first doped region of the first diode structure;
   a second conductive contact that conductively contacts the second doped region of the first diode structure;
   a third conductive contact that is conductively coupled to the third doped region of the second diode structure; and
   a fourth conductive contact that is conductively coupled to the fourth doped region of the second diode structure.

5. The optical device of claim 1, wherein the detector-coupler element is part of an array of detector-coupler elements comprising a plurality of rows and a plurality of columns.

6. The optical device of claim 5, wherein each row of the array comprises multiple detector-coupler elements that are spaced apart from one another and each column of the array comprises multiple detector-coupler elements that are spaced apart from one another.

7. The optical device of claim 5, wherein the plurality of columns has a uniform pitch between adjacent columns.

8. The optical device of claim 1, wherein the detector-coupler element is one of a plurality of detector-coupler elements, wherein each of the detector-coupler elements comprises a plurality of continuous line-type structures arranged in a plurality of columns, wherein a long axis of each of the plurality of line-type structures is oriented substantially transverse to an optical axis of the optical device.

9. The optical device of claim 1, wherein the detector-coupler element comprises a single layer of semiconductor material.

10. The optical device of claim 1, wherein the detector-coupler element comprises:
   a first layer of semiconductor material;
   a second layer of semiconductor material positioned above the first layer of semiconductor material; and
   a layer of insulating material positioned between the first layer of semiconductor material and the second layer of semiconductor material, wherein the first diode structure is positioned in both the first layer of semiconductor material and the second layer of semiconductor material.

11. The optical device of claim 1, wherein the detector-coupler element is one of a plurality of detector-coupler elements, wherein each of the plurality of detector-coupler elements comprises a semiconductor material and wherein the semiconductor material of the base layer and the semiconductor material of the detector-coupler elements are different semiconductor materials.

12. The optical device of claim 1, further comprising an absorber structure positioned above the base layer at a location downstream of the photodetector-coupler in a direction corresponding to an optical axis of the optical device.

13. The optical device of claim 12, wherein the semiconductor material of the base layer is different from the semiconductor material of the plurality of detector-coupler elements and the absorber structure.

14. The optical device of claim 1, further comprising a photodetector structure positioned above the base layer at a location downstream of the photodetector-coupler in a direction corresponding to an optical axis of the optical device, the photodetector structure comprising a third diode structure.

15. An optical device, comprising:
   a semiconductor-on-insulator (SOI) substrate comprising a base semiconductor layer, a buried insulation layer positioned on the base semiconductor layer and an active semiconductor layer positioned on the buried insulation layer;
   a photodetector-coupler, the photodetector-coupler comprising a plurality of detector-coupler elements, wherein each of the plurality of detector-coupler elements physically contacts a surface of the active semiconductor layer;
   a plurality of first diode structures, wherein each of the plurality of first diode structures is positioned in one of the plurality of detector-coupler elements; and
   a plurality of second diode structures positioned in the active semiconductor layer, wherein each of the plurality of second diode structures is positioned vertically below at least a portion of one of the plurality of detector-coupler elements.

16. The optical device of claim 15, further comprising an absorber structure at a location downstream of the photodetector-coupler in a direction corresponding to an optical axis of the optical device, wherein the absorber structure is positioned on and in contact with a surface of the active semiconductor layer.

17. The optical device of claim 16, further comprising a third diode structure positioned in the active semiconductor layer, wherein the third diode structure is positioned at least partially below the absorber structure.

18. The optical device of claim 15, further comprising a photodetector structure at a location downstream of the photodetector-coupler in a direction corresponding to an optical axis of the optical device, wherein the photodetector structure is positioned on and in contact with a surface of the active semiconductor layer.

19. The optical device of claim 18, further comprising a third diode structure positioned in the active semiconductor layer, wherein the third diode structure is positioned at least partially below the photodetector structure.

20. An optical device, comprising:
   a base layer comprising a semiconductor material;
   a photodetector-coupler, the photodetector-coupler comprising a plurality of detector-coupler elements;
   a plurality of first diode structures, wherein each of the plurality of first diode structures is positioned in one of the plurality of detector-coupler elements; and
   a plurality of second diode structures positioned in the base layer, wherein each of the plurality of second diode structures is positioned vertically below at least a portion of one of the plurality of detector-coupler elements.

* * * * *